US012647109B2

(12) United States Patent
Vellore Avadhanam Ramamurthy et al.

(10) Patent No.: US 12,647,109 B2
(45) Date of Patent: Jun. 2, 2026

(54) METHODS AND APPARATUS TO MULTIPLEX DIFFERENTIAL SIGNALS BETWEEN MULTIPLE PORTS

(71) Applicant: Texas Instruments Incorporated, Dallas, TX (US)

(72) Inventors: Srikanth Vellore Avadhanam Ramamurthy, Bengaluru (IN); Akansha Rai, Bengaluru (IN); Amar Kanteti, Bangalore (IN); MD Anwar Sadat, Richardson, TX (US); David Liu, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/901,315

(22) Filed: Sep. 30, 2024

(65) Prior Publication Data

US 2025/0323636 A1     Oct. 16, 2025

Related U.S. Application Data

(60) Provisional application No. 63/650,451, filed on May 22, 2024, provisional application No. 63/639,025, filed on Apr. 26, 2024, provisional application No. 63/633,879, filed on Apr. 15, 2024.

(51) Int. Cl.
        *H03K 17/00*      (2006.01)
        *H03K 19/0175*    (2006.01)
(52) U.S. Cl.
        CPC ... *H03K 17/002* (2013.01); *H03K 19/017509* (2013.01)

(58) Field of Classification Search
        CPC .................................................. H03K 17/002
        USPC ................................................ 327/108–112
        See application file for complete search history.

(56) References Cited

U.S. PATENT DOCUMENTS

2017/0300441 A1* 10/2017 Wang .................... G06F 13/385

OTHER PUBLICATIONS

Hitachi Consumer Electronics Co., Ltd et al., "High-Definition Multimedia Interface Specification," Specification, Oct. 2011, Version 1.4b, HDMI Licensing, LLC, 430 pages.
Video Electronics Standards Association, "VESA DisplayPort (DP) Standard," Standard, Feb. 2016, Version 1.4, 873 pages.

(Continued)

*Primary Examiner* — Tomi Skibinski
(74) *Attorney, Agent, or Firm* — Xianghui Huang; Frank D. Cimino

(57)     ABSTRACT

An example apparatus having a first and second data terminal and including a first transistor having a first terminal, a second terminal, and a control terminal; a second transistor having a first terminal and a control terminal, the first terminal of the second transistor coupled to the first terminal of the first transistor; a third transistor having a first terminal, a second terminal, and a control terminal; a fourth transistor having a first terminal and a control terminal, the first terminal of the fourth transistor coupled to the first terminal of the third transistor; and gate driver circuitry having a first terminal, and a second terminal, the first terminal of the gate driver circuitry coupled to the first data terminal, and the second terminal of the first transistor, the second terminal of the gate driver circuitry coupled to the second data terminal and the second terminal of third transistor.

20 Claims, 10 Drawing Sheets

(56) References Cited

OTHER PUBLICATIONS

HDMI Forum, "High-Definition Multimedia Interface Specification," Specification, Mar. 2016, Version 2.0b, 247 pages.

HDMI Forum, "High-Definition Multimedia Interface Specification," Specification, Nov. 2017, Version 2.1, 518 pages.

Texas Instruments Incorporated, "TS3DV642 12-Channel 1:2 MUX/DEMUX with 1.8 V Compatible Control and Power-Down Mode," Aug. 2018, 34 pages.

Mdeo Electronics Standards Association, "VESA DisplayPort (DP) Standard," Standard, Jun. 2019, Version 2.0, 1143 pages.

Mdeo Electronics Standards Association, "VESA DisplayPort (DP) Standard," Standard, Oct. 2022, Version 2.1, 1560 pages.

Texas Instruments Incorporated, "TMUXHS4612 6-Channel 20Gbps Differential 2:1 Mux / 1:2 Demux Evaluation Module," User's Guide, May 2024, 15 pages.

* cited by examiner

300

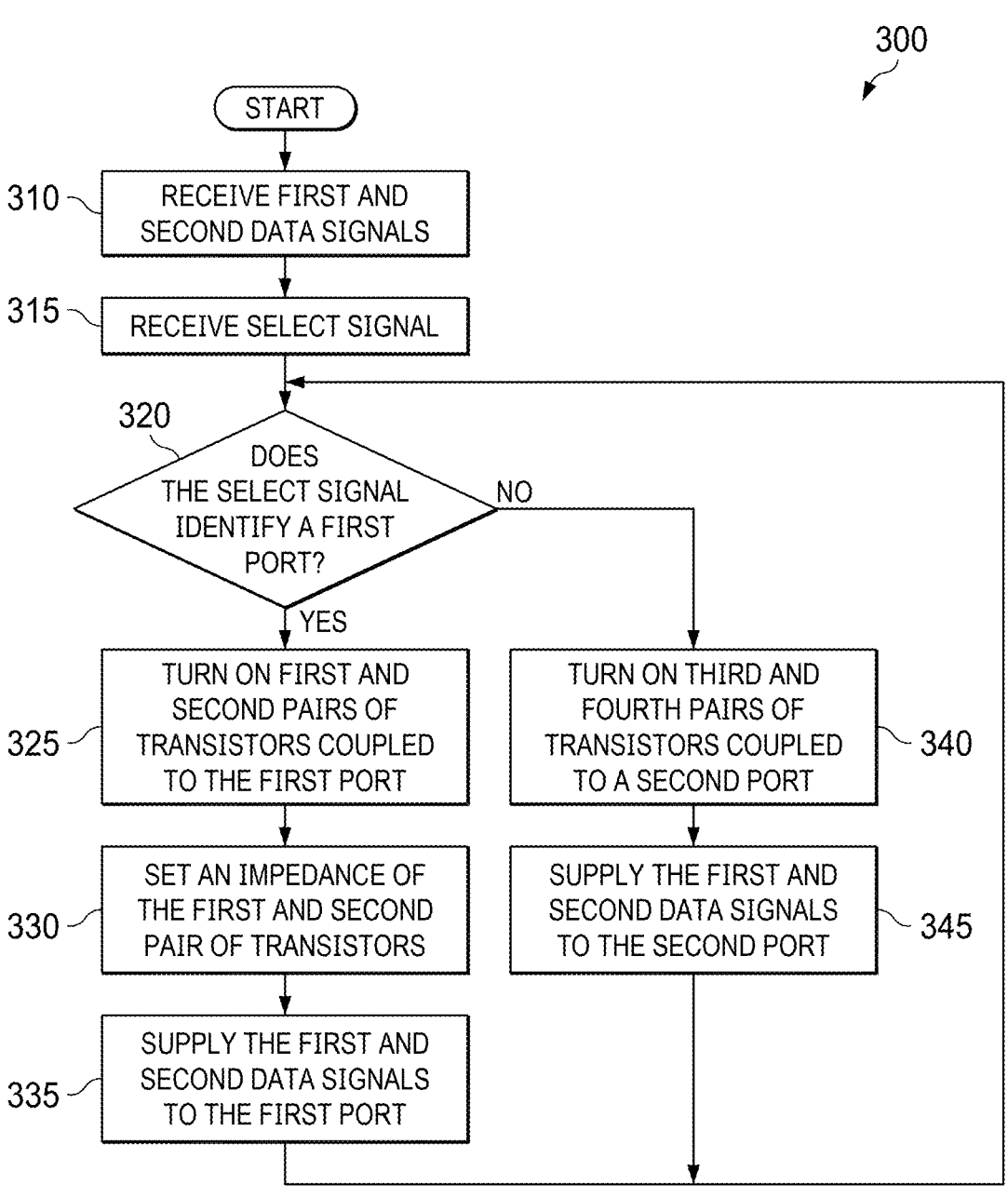

START

310 — RECEIVE FIRST AND SECOND DATA SIGNALS

315 — RECEIVE SELECT SIGNAL

320

DOES THE SELECT SIGNAL IDENTIFY A FIRST PORT?

NO

YES

325 — TURN ON FIRST AND SECOND PAIRS OF TRANSISTORS COUPLED TO THE FIRST PORT

340 — TURN ON THIRD AND FOURTH PAIRS OF TRANSISTORS COUPLED TO A SECOND PORT

330 — SET AN IMPEDANCE OF THE FIRST AND SECOND PAIR OF TRANSISTORS

345 — SUPPLY THE FIRST AND SECOND DATA SIGNALS TO THE SECOND PORT

335 — SUPPLY THE FIRST AND SECOND DATA SIGNALS TO THE FIRST PORT

METHODS AND APPARATUS TO MULTIPLEX DIFFERENTIAL SIGNALS BETWEEN MULTIPLE PORTS

CROSS-REFERENCE TO RELATED APPLICATION

This patent application claims the benefit of and priority to U.S. Provisional Patent Application No. 63/650,451 filed May 22, 2024, U.S. Provisional Patent Application No. 63/633,879 filed Apr. 15, 2024, and U.S. Provisional Patent Application No. 63/639,025 filed Apr. 26, 2024, which are hereby incorporated herein by reference in its entirety.

TECHNICAL FIELD

This description relates generally to multiplexing signals and, more particularly, to methods and apparatus to multiplex differential signals between multiple ports.

BACKGROUND

Multiplexer circuitry routes signals to one of multiple locations. Multiplexer circuitry allows a system to supply signals to different portions of the system using a simple select signal. As electronics continue to advance, multiplexer circuitry continues to implement increasingly advanced techniques to accurately route a wide range of signals.

SUMMARY

For methods and apparatus to multiplex differential signals between multiple ports, an example apparatus having a first data terminal and a second data terminal. The apparatus includes a first transistor having a first terminal, a second terminal, and a control terminal; a second transistor having a first terminal and a control terminal, the first terminal of the second transistor coupled to the first terminal of the first transistor; a third transistor having a first terminal, a second terminal, and a control terminal; a fourth transistor having a first terminal and a control terminal, the first terminal of the fourth transistor coupled to the first terminal of the third transistor; and gate driver circuitry having a first terminal, a second terminal, a third terminal, and a fourth terminal, the first terminal of the gate driver circuitry coupled to the first data terminal, and the second terminal of the first transistor, the second terminal of the gate driver circuitry coupled to the second data terminal and the second terminal of third transistor, the third terminal of the gate driver circuitry coupled to the control terminal of the first transistor and the control terminal of the second transistor, the fourth terminal of the gate driver circuitry coupled to the control terminal of the third transistor and the control terminal of the fourth transistor. Other examples are described.

For methods and apparatus to multiplex differential signals between multiple ports, an example apparatus includes charge pump circuitry having an input and an output; level shifter circuitry having an input, a first output, and a second output, the input of the level shifter circuitry coupled to the output of the charge pump circuitry; a first transistor having a first terminal, a second terminal, and a control terminal; a second transistor having a first terminal, a second terminal, and a control terminal, the first terminal of the second transistor coupled to the input of the charge pump circuitry and the first terminal of the first transistor; a third transistor having a first terminal and a control terminal, the first terminal of the third transistor coupled to the second terminal of the first transistor, the control terminal of the third transistor coupled to the first output of the level shifter circuitry and the control terminal of the first transistor; and a fourth transistor having a first terminal and a control terminal, the first terminal of the fourth transistor coupled to the second terminal of the second transistor, the control terminal of the fourth transistor coupled to the second output of the level shifter circuitry and the control terminal of the second transistor. Other examples are described.

For methods and apparatus to multiplex differential signals between multiple ports, an example apparatus includes gate driver circuitry having an input, a first output, and a second output; a first transistor having a first terminal, a second terminal, a control terminal, and a bulk terminal, the control terminal of the first transistor coupled to the first output of the gate driver circuitry; a first resistor having a first terminal and a second terminal, the first terminal of the first resistor coupled to the bulk terminal of the first transistor; a second resistor having a first terminal and a second terminal, the first terminal of the second resistor coupled to the input of the gate driver circuitry and the first terminal of the first transistor; a second transistor having a first terminal, a second terminal, a control terminal, and a bulk terminal, the control terminal of the second transistor coupled to the second output of the gate driver circuitry; a third resistor having a first terminal and a second terminal, the first terminal of the third resistor coupled to the bulk terminal of the second transistor; and a fourth resistor having a first terminal and a second terminal, the first terminal of the fourth resistor coupled to the first terminal of the second transistor, the second terminal of the fourth resistor coupled to the second terminal of the first transistor, the second terminal of the second transistor, the second terminal of the first resistor, the second terminal of the second resistor, and the second terminal of the third resistor. Other examples are described.

BRIEF DESCRIPTION OF THE DRAWINGS

FIG. 3 is a flowchart representative of example machine-readable instructions or example operations that may be at least one of executed, instantiated, or performed using an example implementation of the multi-port multiplexer circuitry of FIGS. 1 and 2.

Figure 1:
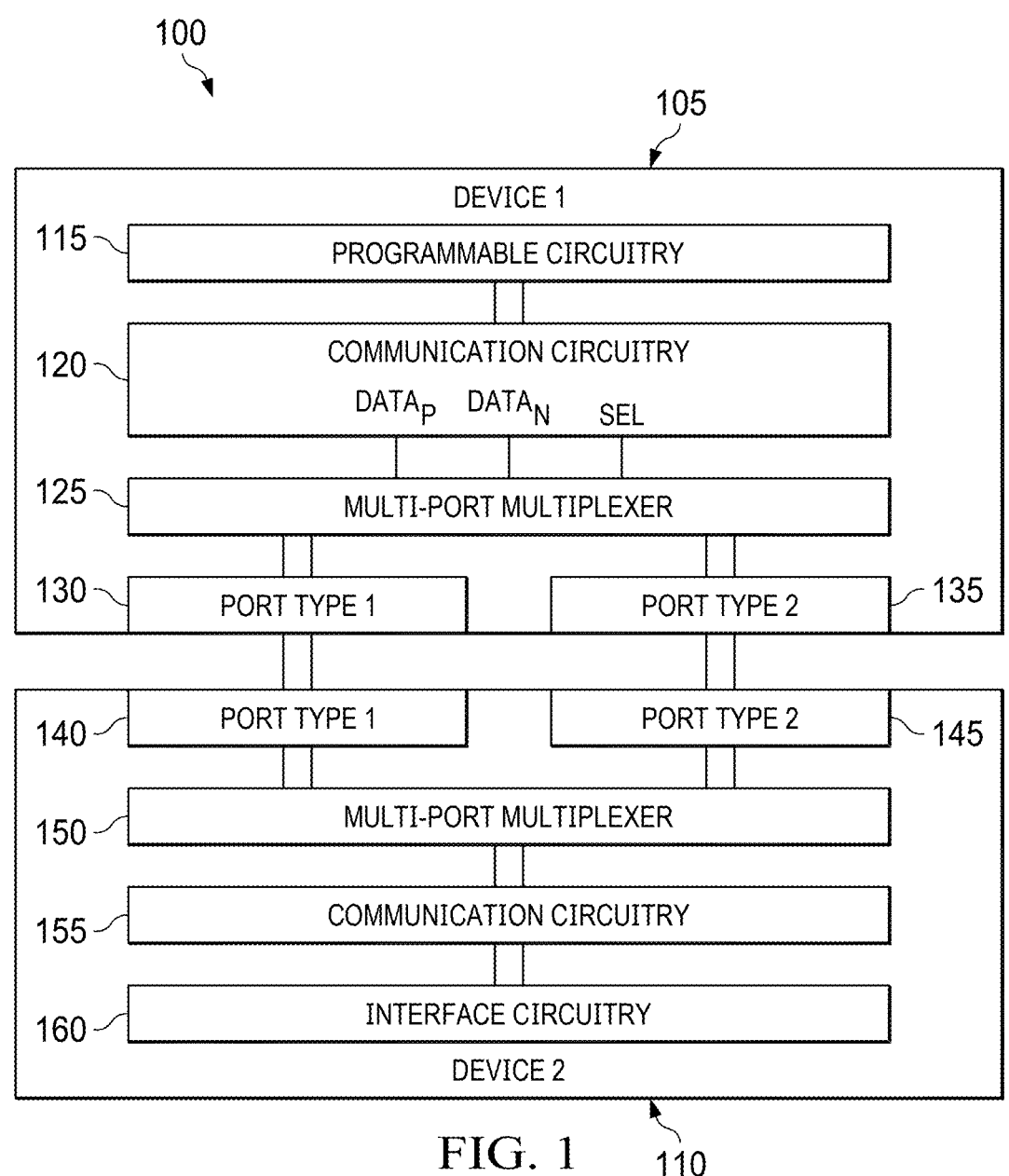
FIG. 1 is a block diagram of an example communication system including multi-port multiplexer circuitry.

The drawings are not necessarily to scale. Generally, the same reference numbers in the drawing(s) and this description refer to the same or similar (functionally and/or structurally) features and/or parts. Although the drawings show regions with clean lines and boundaries, some or all of these lines and boundaries may be idealized. In reality, the boundaries or lines may be unobservable, blended or irregular.

DETAILED DESCRIPTION

Multiplexer circuitry routes signals to one of multiple locations. Multiplexer circuitry allows a system to supply signals to different portions of the system using a simple select signal. As electronics continue to advance, multiplexer circuitry continues to implement increasingly advanced techniques to accurately route a wide range of signals.

In differential systems, differential multiplexer circuitry routes both plus and minus side signals responsive to the state of a select signal. Such differential multiplexer circuitry includes a first transistor, a second transistor, a third transistor, a fourth transistor, and gate driver circuitry. The first and second transistors route the plus side signal responsive to the gate driver circuitry. The third and fourth transistors route the minus side signal responsive to the gate driver circuitry. The gate driver circuitry turns on the first and third transistors and turns off the second and fourth transistors responsive to the select signal being a first value (e.g., logic zero, logical low, etc.). The gate driver circuitry turns off the first and third transistors and turns on the second and fourth transistors responsive to the select signal being a second value (e.g., logic one, logical high, etc.). The differential multiplexer circuitry routes the plus and minus signals to first circuitry using the first and third transistors or second circuitry using the second and fourth transistors.

However, in some differential communication systems, communication circuitry adjusts the plus and minus signals for different communication protocols based on the circuitry to which the signals are being routed. Further, in some systems, such as display systems, different communication protocols use different voltages to represent data of the plus and minus signals. For example, high-definition multimedia interface (HDMI) communications use plus and minus signals having a common mode voltage between two and three-tenths and three and six-tenths volts. However, display port communications use plus and minus signals having a common mode voltage at a common potential (e.g., ground, zero volts, AVSS, etc.). In some such communication protocols, the common mode voltages of differential signals are dictated by universal specifications, which are set by organizations such as the Institute of Electrical and Electronics Engineers (IEEE).

Multi-port multiplexer circuitry includes components that support the different types of communications. Some multi-port multiplexer circuitry utilizes transistors having increased voltage ratings, which support a wide range of common mode voltages, to route the plus and minus signals and support. For example, multi-port multiplexer circuitry uses five-volt transistors to multiplex HDMI communications and display port communications. In such examples, the five-volt transistors can safely operate across the range of common mode voltages of both HDMI and display port communications. As electronics continue to advance, communication protocols continue to support higher speed communications. For example, HDMI 2.1 specifications support communication speeds of twenty gigabits per second (Gbps). However, capacitances of transistors in the multi-port multiplexer circuitry can limit the speed of the data signals. Such capacitances of the transistors increase as the voltage rating of the transistors increases. As communication speeds continue to increase, multiplexer circuitry may fail to meet specifications of advanced communication protocols responsive to capacitances of transistors limiting the bandwidth of the multiplexer circuitry.

Examples described herein include methods and apparatus to multiplex differential signals between multiple ports using multi-port multiplexer circuitry. In some described examples, the multi-port multiplexer circuitry includes pairs of low voltage transistors coupled in series to safely support a range of common mode voltages and increase the bandwidth. In some such described examples, the multi-port multiplexer circuitry includes a first pair of transistors, a second pair of transistors, a third pair of transistors, a fourth pair of transistors, and gate driver circuitry. The first and third pairs of transistors route the plus and minus signals to a first port responsive to control signals from the gate driver circuitry. The second and fourth pairs of transistors route the plus and minus signals to a second port responsive to control signals from the gate driver circuitry. Each pair of transistors includes a first transistor and a second transistor that are coupled in series. The series structure of the transistors divides common mode voltages of signals across the transistors, which allows the multiplexer circuitry to decrease the size of the transistors. The capacitances of the transistors decrease as the transistors decrease. The relatively low voltage transistors increase the bandwidth of the multiplexer circuitry responsive to reductions in capacitances of the transistors.

In some examples, the multiplexer circuitry further includes a series of resistors that divide voltages across inactive transistors (e.g., transistors that are off or not conducting current). For example, when the second and third pairs of transistors supply plus and minus signals having a three and sixth tenths common mode voltage, resistors coupled between terminals of the transistors of the first and second pairs of transistors prevent the common mode voltage of the plus and minus signals from turning on the transistors. In such examples, the multi-port multiplexer circuitry may use one and a half volt transistors responsive to the resistors distributing voltages of the data signals between drain, source, gate, and bulk terminals. Advantageously, transistors rated for one and a half volts have less capacitance in comparison to transistors rated for five volts. Advantageously, reducing transistor sizes using pairs of transistors increases the bandwidth of the multiplexer circuitry.

In some described examples, the multi-port multiplexer circuitry further includes shunt resistor(s). Some communication protocols, such as HDMI, include specifications for maximum impedances of a connection. In such described examples, the shunt resistor(s) are coupled between the transistors of the second and fourth pairs of transistors. The shunt resistor(s) are structured to have resistances that reduce the impedance of the multi-port multiplexer circuitry. Such shunt resistor(s) reduce the impedance resulting from the multi-port multiplexer circuitry, which complies with impedance specifications of communication protocols. Advantageously, adding resistors between the transistors of one or more of the pairs of transistors decreases the impedance added by the multi-port multiplexer circuitry.

In some described examples, the gate driver circuitry includes charge pump circuitry, first level shifter circuitry, second level shifter circuitry, common mode detect circuitry, select control circuitry, and a transistor. The charge pump circuitry generates a control voltage by boosting (e.g., increasing) a common mode voltage of the data signals by a reference voltage. The first level shifter circuitry controls the first and third pairs of transistors using the control voltage responsive to the select signal representing a first communication protocol. The second level shifter circuitry controls the second and fourth pairs of transistors using the control voltage responsive to the select signal representing a second communication protocol. The common mode detect circuitry supplies the common mode voltage of the plus and minus signals to the charge pump circuitry. The select control circuitry detects changes in the select signal. The transistor pulls down the common mode voltage responsive to the select control circuitry detecting a change in the select signal. The charge pump circuitry allows the common mode voltage of the data signals to settle responsive to the select control circuitry detecting a change in the select signal. Advantageously, the select control circuitry allows the common mode voltage of the data signal to settle before adjusting the multi-port multiplexer circuitry.

FIG. 1 is a block diagram of an example communication system 100. In the example of FIG. 1, the communication system 100 includes a first example device 105 and a second example device 110. The example device 105 of FIG. 1 includes example programmable circuitry 115, example communication circuitry 120, example multi-port multiplexer circuitry 125, a first example port 130, and a second example port 135. The example device 110 of FIG. 1 includes a first example port 140, a second example port 145, example multi-port multiplexer circuitry 150, example communication circuitry 155, and example interface circuitry 160. In some examples, the communication system 100 represents a display system. In such examples, the device 105 represents a computing device, such as a personal computer, and the device 110 represents a display device, such as a monitor. In another example, the communication system 100 represents a workstation. In such examples, the device 105 represents a measurement device, such as a test bench, and the device 110 represents a collection device, such as a data store or network storage.

The device 105 has a first terminal, a second terminal, a third terminal, and a fourth terminal. The first, second, third, and fourth terminals of the device 105 are coupled to the device 110. The device 110 has a first terminal, a second terminal, a third terminal, and a fourth terminal. The first, second, third, and fourth terminals of the device 110 are coupled to the device 105. In some examples, the device 105, 110 are coupled by one or more connectors, such as an HDMI cable, display cable, etc.

The programmable circuitry 115 has a first terminal and a second terminal. The first and second terminals of the programmable circuitry 115 are coupled to the communication circuitry 120. In some examples, the programmable circuitry 115 is circuitry structured to instantiate circuitry responsive to the execution of machine-readable instructions. In some such examples, the programmable circuitry 115 may be referred to as a central processing unit (CPU), digital signal processor (DSP), etc.

The communication circuitry 120 has a first terminal, a second terminal, a third terminal, a fourth terminal, and a fifth terminal. The first and second terminals of the communication circuitry 120 are coupled to the programmable circuitry 115. The third, fourth, and fifth terminals of the communication circuitry 120 are coupled to the multi-port multiplexer circuitry 125. In some examples, the communication circuitry 120 may be referred to as output driver circuitry, which produces data signal(s) by driving an output voltage over time. In some examples, the communication circuitry 120 is instantiated by application specific integrated circuitry or programmable circuitry executing communication circuitry instructions to perform operations to produce the plus and minus data signals.

The multi-port multiplexer circuitry 125 has a first terminal, a second terminal, a third terminal, a fourth terminal, a fifth terminal, a sixth terminal, and a seventh terminal. The first, second, and third terminals of the multi-port multiplexer circuitry 125 are coupled to the communication circuitry 120. In some examples, the first and second terminals of the multi-port multiplexer circuitry 125 may be referred to as a data terminal. The fourth and fifth terminals of the multi-port multiplexer circuitry 125 are coupled to the port 130. The sixth and seventh terminals of the multi-port multiplexer circuitry 125 are coupled to the port 135. Examples of the multi-port multiplexer circuitry 125 are further illustrated and described in connection with FIGS. 2 and 5, below.

The port 130 has a first terminal, a second terminal, a third terminal, and a fourth terminal. The first and second terminals of the port 130 are coupled to the multi-port multiplexer circuitry 125. The third and fourth terminals of the port 130 are coupled to the port 140. The port 135 has a first terminal, a second terminal, a third terminal, and a fourth terminal. The first and second terminals of the port 135 are coupled to the multi-port multiplexer circuitry 125. The third and fourth terminals of the port 135 are coupled to the port 145. In the example of FIG. 1, the ports 130, 135 are structured to support a first and second type of communication. For example, the port 130 may be a display port and the port 135 may be an HDMI port.

The port 140 has a first terminal, a second terminal, a third terminal, and a fourth terminal. The first and second terminals of the port 140 are coupled to the port 130. The third and fourth terminals of the port 140 are coupled to the multi-port multiplexer circuitry 150. The port 145 has a first terminal, a second terminal, a third terminal, and a fourth terminal. The first and second terminals of the port 145 are coupled to the port 135. The third and fourth terminals of the port 145 are coupled to the multi-port multiplexer circuitry 150. In the example of FIG. 1, the ports 140, 145 are structured to support a first and second type of communication. For example, the port 140 may be a display port and the port 145 may be an HDMI port.

The multi-port multiplexer circuitry 150 has a first terminal, a second terminal, a third terminal, a fourth terminal, a fifth terminal, and a sixth terminal. The first and second terminals of the multi-port multiplexer circuitry 150 are coupled to the port 140. The third and fourth terminals of the multi-port multiplexer circuitry 150 are coupled to the port 145. The fifth and sixth terminals of the multi-port multiplexer circuitry 150 are coupled to the communication circuitry 155. Examples of the multi-port multiplexer circuitry 150 are further illustrated and described in connection with FIGS. 2 and 5, below.

The communication circuitry 155 has a first terminal, a second terminal, a third terminal, and a fourth terminal. The first and second terminals of the communication circuitry 155 are coupled to the multi-port multiplexer circuitry 150. The third and fourth terminals of the communication circuitry 155 are coupled to the interface circuitry 160. In the example of FIG. 1, the communication circuitry 155 receives the plus and minus data signals from one of the ports 140, 145. In some examples, similar to the communication circuitry 120 of the device 105, the communication circuitry 155 may generate a select signal, which controls the routing of the multi-port multiplexer circuitry 150. In some such examples, the communication circuitry 155 may determine the routing of data signals through the multi-port multiplexer circuitry 150 responsive to a determination of which of the ports 140, 145 receive data signals from the ports 130, 135. In some examples, the communication circuitry 155 is instantiated by application specific integrated circuitry or programmable circuitry executing communication circuitry instructions to perform operations to receive the plus and minus data signals.

The interface circuitry 160 has a first terminal and a second terminal. The first and second terminals of the interface circuitry 160 are coupled to the communication circuitry 155. In some examples, the interface circuitry 160 is a display, such as a screen. In other examples, the interface circuitry 160 is data collection circuitry.

In example operation, the programmable circuitry 115 is structured to supply data to the device 110. The communication circuitry 120 generates plus and minus data signals ($DATA_P$, $DATA_N$) responsive to the data from the programmable circuitry 115. Also, the communication circuitry 120 generates a select signal (SEL) to control the multi-port multiplexer circuitry 125. In some examples, the select signal is based on the communication protocol implemented by the plus and minus data signals. In such examples, the communication circuitry 120 controls which of the ports 130, 135 the multi-port multiplexer circuitry 125 routes the plus and minus data signals to. For example, the multi-port multiplexer circuitry 125 routes the plus and minus data signals to a display port responsive to the communication circuitry 120 setting the select signal to a first state (e.g., logical high, logic one, etc.). In such examples, the multi-port multiplexer circuitry 125 routes the plus and minus data signals to an HDMI port responsive to the communication circuitry 120 setting the select signal to a second state (e.g., logical low, logic zero, etc.). Also, the multi-port multiplexer circuitry 125 may determine which of the ports 130, 135 to route the plus and minus data signals responsive to a common mode voltage of the plus and minus data signals. For example, the communication circuitry 120 sets the common mode voltage of the plus and minus data signals to a common potential to implement display protocols. In such an example, the communication circuitry 120 sets the common mode voltage of the plus and minus data signals between two and four volts to implement HDMI protocols.

In such example operations, the multi-port multiplexer circuitry 125 supplies the plus and minus data signals to one of the ports 130, 135 responsive to the state of the select signal. Example operations of the multi-port multiplexer circuitry 125 are further illustrated and described in connection with FIG. 3, below. The ports 130, 135 supply the plus and minus data signals to the ports 140, 145. The multi-port multiplexer circuitry 150 routes the plus and minus data signals to the communication circuitry 155. In some examples, the multi-port multiplexer circuitry 150 determines which of the ports 140, 145 receive the plus and minus data signals based on a common mode voltage of signals at the ports 140, 145. The communication circuitry

155 converts data from the plus and minus data signals to provide data at the interface circuitry 160. In some examples, the communication circuitry 155 interfaces with display drivers to display images on the interface circuitry 160. Advantageously, the multi-port multiplexer circuitry 125, 150 allow the programmable circuitry 115 to communicate with the interface circuitry 160 using multiple different communication protocols.

Figure 2:
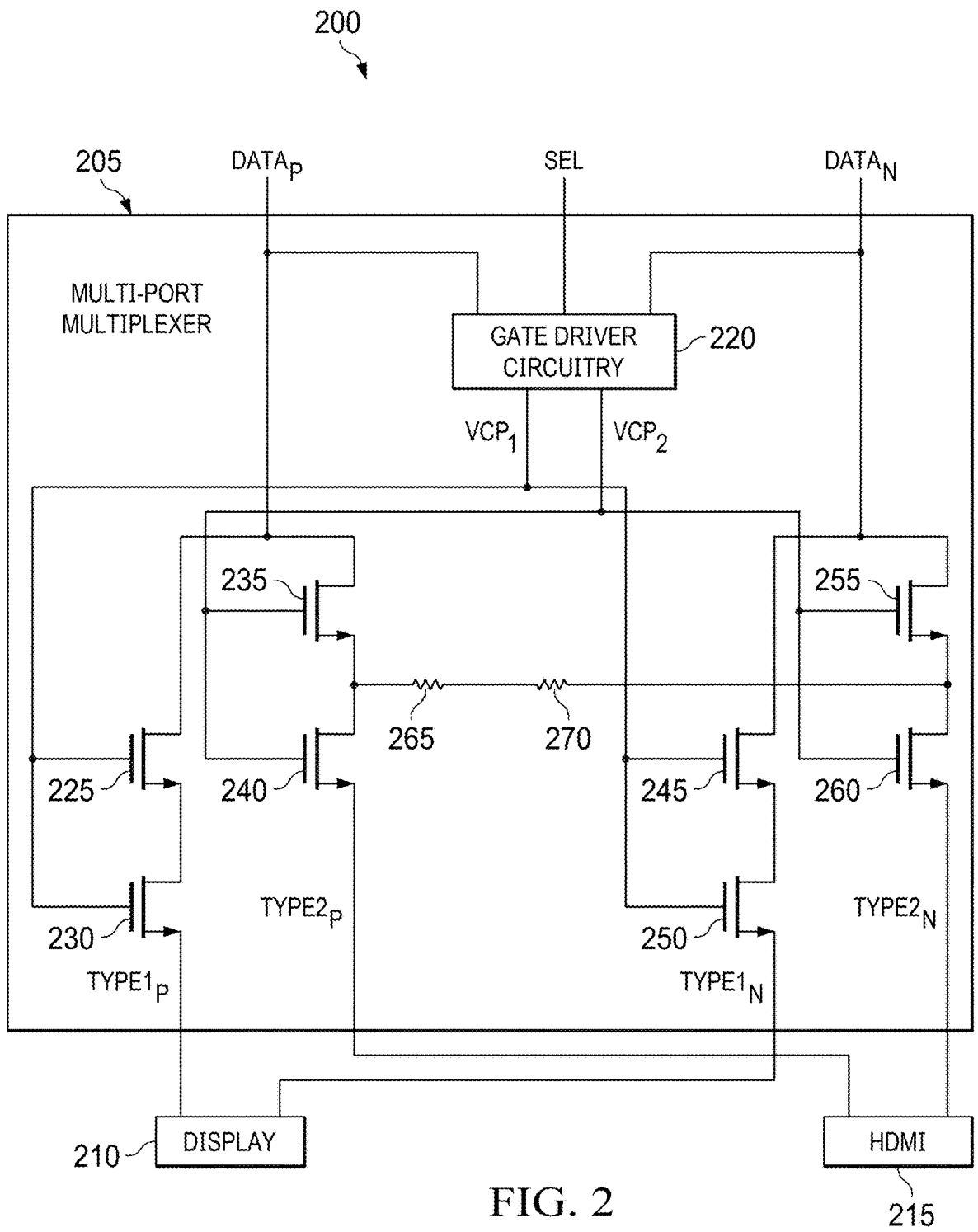
FIG. 2 is a schematic diagram of an example multiplexer system including an example of the multi-port multiplexer circuitry of FIG. 1 having example gate driver circuitry.

FIG. 2 is a schematic diagram of an example multiplexer system 200 including example multi-port multiplexer circuitry 205, which is an example of the multi-port multiplexer circuitry 125 an example display port 210, and an example HDMI port 215. The example multi-port multiplexer circuitry 205 of FIG. 2 includes example gate driver circuitry 220, a first example transistor 225, a second example transistor 230, a third example transistor 235, a fourth example transistor 240, a fifth example transistor 245, a sixth example transistor 250, a seventh example transistor 255, an eighth example transistor 260, a first example resistor 265, and a second example resistor 270.

The multiplexer system 200 has a first data input, a second data input, a select input, a first output, and a second output. The first and second data inputs (also referred to as data terminals) of the multiplexer system 200 are structured to be coupled to the communication circuitry 120 of FIG. 1, which supplies the plus side and minus data signals ($DATA_P$, $DATA_N$). The select input of the multiplexer system 200 is structured to be coupled to the communication circuitry 120, which supplies the select signal (SEL). The first output of the multiplexer system 200 is structured to be coupled to the port 140 of FIG. 1. The second output of the multiplexer system 200 is structured to be coupled to the port 145 of FIG. 1.

The multi-port multiplexer circuitry 205 has a first terminal, a second terminal, a third terminal, a fourth terminal, a fifth terminal, a sixth terminal, and a seventh terminal. The first terminal of the multi-port multiplexer circuitry 205 is coupled to the first input of the multiplexer system 200, which supplies the plus side data signal. The second terminal of the multi-port multiplexer circuitry 205 is coupled to the second input of the multiplexer system 200, which supplies the minus side data signal. The third terminal of the multi-port multiplexer circuitry 205 is coupled to the third input of the multiplexer system 200, which supplies the select signal. The fourth and fifth terminals of the multi-port multiplexer circuitry 205 are coupled to the display port 210. The sixth and seventh terminals of the multi-port multiplexer circuitry 205 are coupled to the HDMI port 215.

The display port 210 has a first terminal and a second terminal. The first and second terminals of the display port 210 are coupled to the multi-port multiplexer circuitry 205, which supplies a plus first type signal ($TYPE1_P$) and a minus first type signal ($TYPE1_N$). The plus and minus first type signals represent a differential pair of signals that the multi-port multiplexer circuitry 205 supplies to the display port 210. In the example of FIG. 2, the plus and minus first type signals represent signals using display communication protocols. The display port 210 is an example of the port 130 of FIG. 1.

The HDMI port 215 has a first terminal and a second terminal. The first and second terminals of the HDMI port 215 are coupled to the multi-port multiplexer circuitry 205, which supplies a plus second type signal ($TYPE2_P$) and a minus second type signal ($TYPE2_N$). The plus and minus second type signals represent a differential pair of signals that the multi-port multiplexer circuitry 205 supplies to the HDMI port 215. In the example of FIG. 2, the plus and minus second type signals represent signals using HDMI communication protocols. The HDMI port 215 is an example of the port 135 of FIG. 1.

The gate driver circuitry 220 has a first terminal, a second terminal, a third terminal, a fourth terminal, and a fifth terminal. The first terminal of the gate driver circuitry 220 is coupled to the transistors 225, 235 and the first input of the multiplexer system 200, which supplies the plus data signal. The second terminal of the gate driver circuitry 220 is coupled to the transistors 245, 255 and the second input of the multiplexer system 200, which supplies the minus data signal. The third terminal of the gate driver circuitry 220 is coupled to the third input of the multiplexer system 200, which supplies the select signal. The fourth terminal of the gate driver circuitry 220 is coupled to the transistors 225, 230, 245, 250, which receive a first control signal $(VCP_1)$. The first control signal drives the transistors 225, 230, 245, 250 to route the plus and minus data signals to the display port 210. The fifth terminal of the gate driver circuitry 220 is coupled to the transistors 235, 240, 255, 260, which receive a second control signal $(VCP_2)$. The second control signal drives the transistors 225, 230, 245, 250 to route the plus and minus data signals to the HDMI port 215. An example of the gate driver circuitry 220 is further illustrated and described in connection with FIG. 7, below.

The transistor 225 has a first terminal, a second terminal, and a control terminal. The first terminal of the transistor 225 is coupled to the gate driver circuitry 220, the transistor 235, and the first input of the multiplexer system 200, which supplies the plus side data signal. The second terminal of the transistor 225 is coupled to the transistor 230. The control terminal of the transistor 225 is coupled to the gate driver circuitry 220 and the transistors 230, 245, 250.

The transistor 230 has a first terminal, a second terminal, and a control terminal. The first terminal of the transistor 230 is coupled to the transistor 225. The second terminal of the transistor 230 is coupled to the display port 210. The control terminal of the transistor 230 is coupled to the gate driver circuitry 220 and the transistors 225, 245, 250.

The transistor 235 has a first terminal, a second terminal, and a control terminal. The first terminal of the transistor 235 is coupled to the gate driver circuitry 220, the transistor 225, and the first input of the multiplexer system 200, which supplies the plus side data signal. The second terminal of the transistor 235 is coupled to the transistor 240 and the resistor 265. The control terminal of the transistor 235 is coupled to the gate driver circuitry 220 and the transistors 240, 255, 260.

The transistor 240 has a first terminal, a second terminal, and a control terminal. The first terminal of the transistor 240 is coupled to the transistor 235 and the resistor 265. The second terminal of the transistor 240 is coupled to the HDMI port 215. The control terminal of the transistor 240 is coupled to the gate driver circuitry 220 and the transistors 235, 255, 260.

The transistor 245 has a first terminal, a second terminal, and a control terminal. The first terminal of the transistor 245 is coupled to the gate driver circuitry 220, the transistor 255, and the second input of the multiplexer system 200, which supplies the minus side data signal. The second terminal of the transistor 245 is coupled to the transistor 250. The control terminal of the transistor 245 is coupled to the gate driver circuitry 220 and the transistors 225, 230, 250.

The transistor 250 has a first terminal, a second terminal, and a control terminal. The first terminal of the transistor 250 is coupled to the transistor 245. The second terminal of the transistor 250 is coupled to the display port 210. The control terminal of the transistor 250 is coupled to the gate driver circuitry 220 and the transistors 225, 230, 245.

The transistor 255 has a first terminal, a second terminal, and a control terminal. The first terminal of the transistor 255 is coupled to the gate driver circuitry 220, the transistor 245, and the second input of the multiplexer system 200, which supplies the minus data signal. The second terminal of the transistor 255 is coupled to the transistor 260 and the resistor 270. The control terminal of the transistor 255 is coupled to the gate driver circuitry 220 and the transistors 235, 240, 260.

The transistor 260 has a first terminal, a second terminal, and a control terminal. The first terminal of the transistor 260 is coupled to the transistor 255 and the resistor 270. The second terminal of the transistor 260 is coupled to the HDMI port 215. The control terminal of the transistor 260 is coupled to the gate driver circuitry 220 and the transistors 235, 240, 255.

The resistor 265 has a first terminal and a second terminal. The first terminal of the resistor 265 is coupled to the transistors 235, 240. The second terminal of the resistor 265 is coupled to the resistor 270. The resistor 270 has a first terminal and a second terminal. The first terminal of the resistor 270 is coupled to the resistor 265. The second terminal of the resistor 270 is coupled to the transistors 255, 260. In some examples, the resistors 265, 270 are referred to as shunt resistors.

In the example of FIG. 2, the transistors 225, 230, 235, 240, 245, 250, 255, 260 are n-channel metal-oxide semiconductor field-effect transistors (MOSFETs). Alternatively, the transistors 225, 230, 235, 240, 245, 250, 255, 260 may be n-channel field-effect transistors (FETs), n-channel insulated-gate bipolar transistors (IGBTs), n-channel junction field effect transistors (JFETs), NPN bipolar junction transistors (BJTs) or, with slight modifications, p-type equivalent devices. The transistors 225, 230, 235, 240, 245, 250, 255, 260 may be depletion mode devices, drain-extended devices, enhancement mode devices, natural transistors or other types of device structure transistors. Furthermore, the transistors 225, 230, 235, 240, 245, 250, 255, 260 may be implemented in/over a silicon substrate (Si), a silicon carbide substrate (SiC), a gallium nitride substrate (GaN) or a gallium arsenide substrate (GaAs).

FIG. 3 is a flowchart representative of example machine-readable instructions or example operations 300 that may be at least one of executed, instantiated, or performed using an example implementation of the multi-port multiplexer circuitry 125, 150, 205 of FIGS. 1 and 2. The example operations 300 of FIG. 3 begin at Block 310 at which the transistors 225, 235, 245, 255 of FIG. 2 receive first and second data signals. In example operations, the communication circuitry 120 of FIG. 1 supplies plus and minus data signals $(DATA_P, DATA_N)$ to the multi-port multiplexer circuitry 205 as a differential pair of input signals. In such examples, the transistors 225, 235 receive the plus data signal and the transistors 245, 255 receive the minus data signal.

The gate driver circuitry 220 of FIG. 2 receives a select signal. (Block 315). In example operations, the communication circuitry 120 supplies a select signal (SEL) to the multi-port multiplexer circuitry 205. The select signal represents the communication protocols used to produce the plus and minus data signals. For example, the communication circuitry 120 sets the select signal to a logic zero (e.g., logical low) responsive to generating the plus and minus data signals using a first communication protocol that is specific to the display port 210. In such examples, the communication circuitry 120 sets the select signal to a logic one (e.g., logical high) responsive to generating the plus and minus data signals using a second communication protocol that is specific to the HDMI port 215.

The gate driver circuitry 220 determines if the select signal identifies a first port. (Block 320). In example operations, the gate driver circuitry 220 routes the plus and minus data signals to one of the ports 210, 215 responsive to the select signal. For example, the gate driver circuitry 220 controls the multi-port multiplexer circuitry 200 to supply the plus and minus data signals to the display port 210 responsive to the select signal being a first value. In such examples, the gate driver circuitry 220 controls the multi-port multiplexer circuitry 200 to supply the plus and minus data signals to the HDMI port 215 responsive to the select signal being a second value.

If the gate driver circuitry 220 determines that the select signal identifies the first port (e.g., Block 320 returns a result of YES), the gate driver circuitry 220 turns on first and second pairs of transistors coupled to the first port. (Block 325). In some examples, the transistors 235, 240 of FIG. 2 form a first pair of transistors coupled to the HDMI port 215 and the transistors 255, 260 form a second pair of transistors coupled to the HDMI port 215. In such examples, the gate driver circuitry 220 turns on the transistors 235, 240 to route the plus data signal to the HDMI port 215 and turns on the transistors 255, 260 to route the minus data signal to the HDMI port 215.

The resistors 265, 270 of FIG. 2 set an impedance of the first and second pair of transistors. (Block 330). In example operations, the transistors 235, 240, 255, 260 are controlled to route signals for HDMI communication protocols. In such example operations, the resistors 265, 270 set an impedance seen by the HDMI port 215. In some examples, the resistors 265, 270 reduce the impedance of the traces between the communication circuitry 120 and the HDMI port 215 to comply with HDMI specifications. Such an impedance compliance for HDMI specifications is further illustrated and described in connection with FIG. 4, below.

The transistors 235, 240, 255, 260 of FIG. 2 supply the first and second data signals to the first port. (Block 335). In example operations, the transistors 235, 240 supply the plus data signal to the HDMI port 215, and the transistors 255, 260 supply the minus data signal to the HDMI port 215 responsive to the gate driver circuitry 220 controlling the transistors 235, 240, 255, 260 to conduct current.

If the gate driver circuitry 220 determines that the select signal does not identify the first port (e.g., Block 320 returns a result of NO), the gate driver circuitry 220 turns on third and fourth pairs of transistors coupled to a second port. (Block 340). In some examples, the transistors 225, 230 of FIG. 2 form a third pair of transistors, which are coupled to the display port 210, and the transistors 245, 250 form a fourth pair of transistors, which are coupled to the display port 210. In such examples, the gate driver circuitry 220 turns on the transistors 225, 230 to route the plus data signal to the display port 210 and turns on the transistors 245, 250 to route the minus data signal to the display port 210.

The transistors 225, 230, 245, 250 of FIG. 2 supply the first and second data signals to the second port. (Block 345). In example operations, the transistors 225, 230 supply the plus data signal to the display port 210, and the transistors 245, 250 supply the minus data signal to the display port 210, responsive to the gate driver circuitry 220 structuring the transistors 225, 230, 245, 250 to conduct current. Control proceeds to return to Block 320.

Example methods are described with reference to the flowchart illustrated in FIG. 3. However, many other methods of implementing the multi-port multiplexer circuitry 125, 150, 205 of FIGS. 1 and 2 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 4:
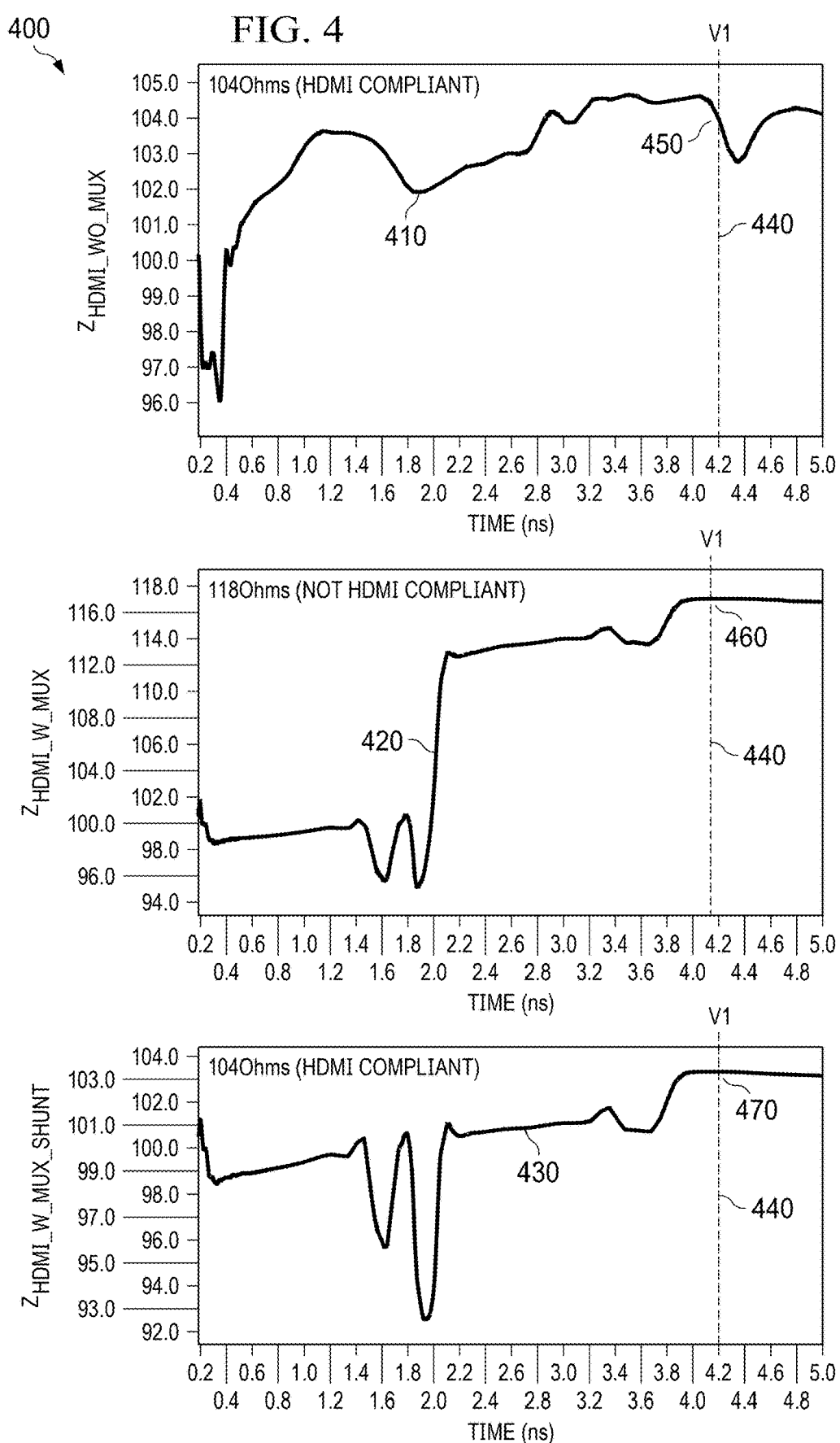
FIG. 4 is a plot of example impedances of the multi-port multiplexer circuitry of FIGS. 1 and 2.

FIG. 4 is a timing diagram 400 of example operations of the multi-port multiplexer circuitry 125, 150, 205 of FIGS. 1 and 2. In the example of FIG. 4, the timing diagram 400 includes a first impedance plot 410, a second impedance plot 420, and a third impedance plot 430. The first impedance plot 410 illustrates a differential impedance of the HDMI port 215 of FIG. 2 without the multi-port multiplexer circuitry 205 of FIG. 2. For example, the communication circuitry 120 of FIG. 1 is directly connected to the port 135 of FIG. 1. The second impedance plot 420 illustrates a differential impedance of the HDMI port 215 with the multi-port multiplexer circuitry 205 and without the resistors 265, 270 of FIG. 2. For example, the resistors 265, 270 are not included in the multi-port multiplexer circuitry 205. The third impedance plot 430 illustrates a differential impedance of the HDMI port 215 with the resistors 265, 270.

At a first time 440, the first impedance plot 410 has a first impedance 450, the second impedance plot 420 has a second impedance 460, and the third impedance plot 430 has a third impedance 470. In example operations, HDMI specifications set compliance of an impedance seen by a device between ninety and one-hundred and ten ohms. In the example of the first impedance plot 410, without the multi-port multiplexer circuitry 205, the device 105 is HDMI compliant. In the example of the second impedance plot 420, with the multi-port multiplexer circuitry 205, but without the resistors 265, 270, the impedance 460 is not HDMI compliant. Advantageously, in the example of the third impedance plot 430, with the multi-port multiplexer circuitry 205 and the resistors 265, 270, the impedance 470 is HDMI compliant. Advantageously, the resistors 265, 270 can set the impedance of the current paths formed by the transistors 235, 240, 255, 260 of FIG. 2 to meet HDMI specifications.

Figure 5:
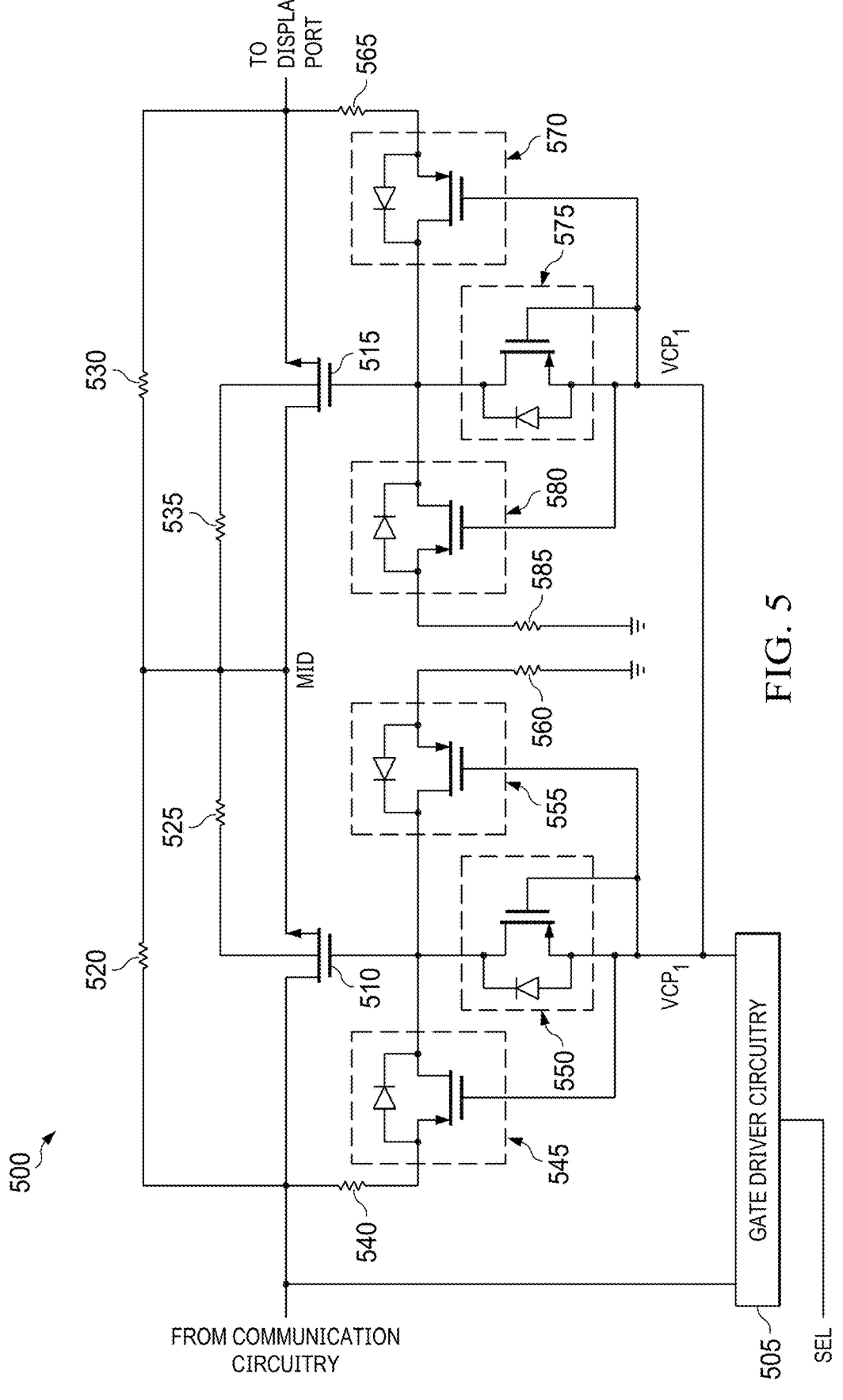
FIG. 5 is a schematic diagram of example signal path circuitry of the multi-port multiplexer circuitry of FIGS. 1 and 2 including an example of the gate driver circuitry of FIG. 2.

FIG. 5 is a schematic diagram of example signal path circuitry 500. The example signal path circuitry 500 of FIG. 5 includes example gate driver circuitry 505, a first example transistor 510, a second example transistor 515, a first example resistor 520, a second example resistor 525, a third example resistor 530, a fourth example resistor 535, a fifth example resistor 540, a third example transistor 545, a fourth example transistor 550, a fifth example transistor 555, a sixth example resistor 560, a seventh example resistor 565, a sixth example transistor 570, a seventh example transistor 575, an eighth example transistor 580, and an eighth example resistor 585.

The signal path circuitry 500 has a first input, a second input, and an output. The first input of the signal path circuitry 500 is coupled to the communication circuitry 120 of FIG. 1, which supplies a plus data signal (DATA$_P$). The second input of the signal path circuitry 500 is coupled to the communication circuitry 120, which supplies a select signal (SEL). The output of the signal path circuitry 500 is coupled to the port 130 of FIG. 1 or the port 210 of FIG. 2. In the example of FIG. 5, the transistors 510, 515 are an example of the transistors 225, 230 of FIG. 2. In such an example, the signal path circuitry 500 illustrates a signal path corresponding to routing the plus data signal through the transistors 225, 230 of FIG. 2. However, the signal path circuitry 500 may represent the routing of either one of the plus or minus data signals through the signal paths formed by the transistors 235, 240, 245, 250, 255, 260. For example, the first inputs or the output of the signal path circuitry 500 may be modified to represent a different pair of transistors from FIG. 2, such as the transistors 235, 240, the transistors 245, 250, or the transistors 255, 260. Accordingly, some examples of the multi-port multiplexer circuitry 205 of FIG. 2 include four instances of the signal path circuitry 500 of FIG. 5, which implement routing of the transistors 225, 230, 235, 240, 245, 250, 255, 260. Such examples are further described in connection with FIG. 6, below.

The gate driver circuitry 505 has a first terminal, a second terminal, and a third terminal. The first terminal of the gate driver circuitry 505 is coupled to the transistor 510, the resistors 520, 540, and the first input of the signal path circuitry 500, which supplies the plus side data signal. The second terminal of the gate driver circuitry 505 is coupled to the second input of the signal path circuitry 500, which supplies the select signal. The third terminal of the gate driver circuitry 505 is coupled to the transistors 545, 550, 555, 570, 575, 580, which supplies the first control signal ($V_{CP1}$). The gate driver circuitry 505 is an example of the gate driver circuitry 220 of FIG. 2. Another example of the gate driver circuitry 505 is further illustrated and described in connection with FIG. 7, below.

The transistor 510 has a first terminal, a second terminal, a third terminal, and a control terminal. The first terminal of the transistor 510 is coupled to the gate driver circuitry 505, the resistors 520, 540, and the first input of the signal path circuitry 500, which supplies the plus side data signal. The second terminal of the transistor 510 is coupled to the transistor 515 and the resistors 520, 525, 530, 535. The third terminal of the transistor 510 (also referred to as a bulk terminal) is coupled to the resistor 525. The control terminal of the transistor 510 is coupled to the transistor 545, 550, 555.

The transistor 515 has a first terminal, a second terminal, a third terminal, and a control terminal. The first terminal of the transistor 515 is coupled to the transistor 515 and the resistors 520, 525, 530, 535. The second terminal of the transistor 515 is coupled to the resistors 530, 565 and the output of the signal path circuitry 500. The third terminal of the transistor 515 (also referred to as a bulk terminal) is coupled to the resistor 535. The control terminal of the transistor 515 is coupled to the transistors 570, 575, 580.

The resistor 520 has a first terminal and a second terminal. The first terminal of the resistor 520 is coupled to the gate driver circuitry 505, the transistor 510, the resistor 540, and the first input of the signal path circuitry 500, which supplies the plus data signal. The second terminal of the resistor 520 is coupled to the transistors 510, 515 and the resistors 525, 530, 535. The resistor 525 has a first terminal and a second terminal. The first terminal of the resistor 525 is coupled to the transistor 510. The second terminal of the resistor 525 is coupled to the transistors 510, 515 and the resistors 520, 530, 535.

The resistor 530 has a first terminal and a second terminal. The first terminal of the resistor 530 is coupled to the transistors 510, 515 and the resistors 520, 525, 535. The second terminal of the resistor 530 is coupled to the transistor 515, the resistor 565, and the output of the signal path circuitry 500. The resistor 535 has a first terminal and a second terminal. The first terminal of the resistor 535 is coupled to the transistors 510, 515 and the resistors 520, 525, 530. The second terminal of the resistor 535 is coupled to the transistor 515.

The resistor 540 has a first terminal and a second terminal. The first terminal of the resistor 540 is coupled to the transistor 510, the resistor 520, and the first input of the signal path circuitry 500, which supplies the plus data signal. The second terminal of the resistor 540 is coupled to the transistor 545.

The transistor 545 has a first terminal, a second terminal, and a control terminal. The first terminal of the transistor 545 is coupled to the resistor 540. The second terminal of the transistor 545 is coupled to the transistors 510, 550, 555. The control terminal of the transistor 545 is coupled to the gate driver circuitry 505 and the transistors 550, 555, 570, 575, 580. The transistor 550 has a first terminal, a second terminal, and a control terminal. The first terminal of the transistor 550 is coupled to the transistors 510, 545, 555. The second and control terminals of the transistor 550 are coupled to the gate driver circuitry 505 and the transistors 545, 555, 570, 575, 580. The transistor 555 has a first terminal, a second terminal, and a control terminal. The first terminal of the transistor 555 is coupled to the transistors 510, 545, 550. The second terminal of the transistor 555 is coupled to the resistor 560. The control terminal of the transistor 555 is coupled to the gate driver circuitry 505 and the transistors 545, 550, 570, 575, 580. In the example of FIG. 5, the body diodes of the transistors 545, 550, 555 are illustrated. In some examples, the body diodes of the transistors 545, 550, 555 may not be illustrated or described.

The resistor 560 has a first terminal and a second terminal. The first terminal of the resistor 560 is coupled to the transistor 555. The second terminal of the resistor 560 is coupled to the common terminal, which supplies the common potential.

The resistor 565 has a first terminal and a second terminal. The first terminal of the resistor 565 is coupled to the transistor 515, the resistor 530, and the output of the signal path circuitry 500. The second terminal of the resistor 565 is coupled to the transistor 570.

The transistor 570 has a first terminal, a second terminal, and a control terminal. The first terminal of the transistor 570 is coupled to the resistor 565. The second terminal of the transistor 570 is coupled to the transistors 515, 575, 580. The control terminal of the transistor 570 is coupled to the gate driver circuitry 505 and the transistors 545, 550, 555, 575, 580. The transistor 575 has a first terminal, a second terminal, and a control terminal. The first terminal of the transistor 575 is coupled to the transistors 515, 570, 580. The second and control terminals of the transistor 575 are coupled to the gate driver circuitry 505 and the transistors 545, 550, 555, 570, 580. The transistor 580 has a first terminal, a second terminal, and a control terminal. The first terminal of the transistor 580 is coupled to the transistors 515, 570, 575. The second terminal of the transistor 580 is coupled to the resistor 585. The control terminal of the transistor 580 is coupled to the gate driver circuitry 505 and the transistors 545, 550, 555, 570, 575. In the example of FIG. 5, the body diodes of the transistors 570, 575, 580 are illustrated. In some examples, the body diodes of the transistors 570, 575, 580 may not be illustrated or described.

The resistor 585 has a first terminal and a second terminal. The first terminal of the resistor 585 is coupled to the transistor 580. The second terminal of the resistor 585 is coupled to the common terminal, which supplies the common potential.

In the example of FIG. 5, the transistors 510, 515 are n-channel MOSFETs. Alternatively, the transistors 510, 515 may be n-channel FETs, n-channel IGBTs, n-channel JFETs, NPN BJTs or, with slight modifications, p-type equivalent devices. In the example of FIG. 5, the transistors 545, 550, 555, 570, 575, 580 are p-channel MOSFETs. Alternatively, the transistors 545, 550, 555, 570, 575, 580 may be p-channel FETs, p-channel IGBTs, p-channel JFETs, PNP BJTs, or, with slight modifications, N-type equivalent devices. The transistors 510, 515, 545, 550, 555, 570, 575, 580 may be depletion mode devices, drain-extended devices, enhancement mode devices, natural transistors or other type of device structure transistors. Furthermore, the transistors 510, 515, 545, 550, 555, 570, 575, 580 may be implemented in/over a silicon substrate (Si), a silicon carbide substrate (SiC), a gallium nitride substrate (GaN) or a gallium arsenide substrate (GaAs).

Figure 6:
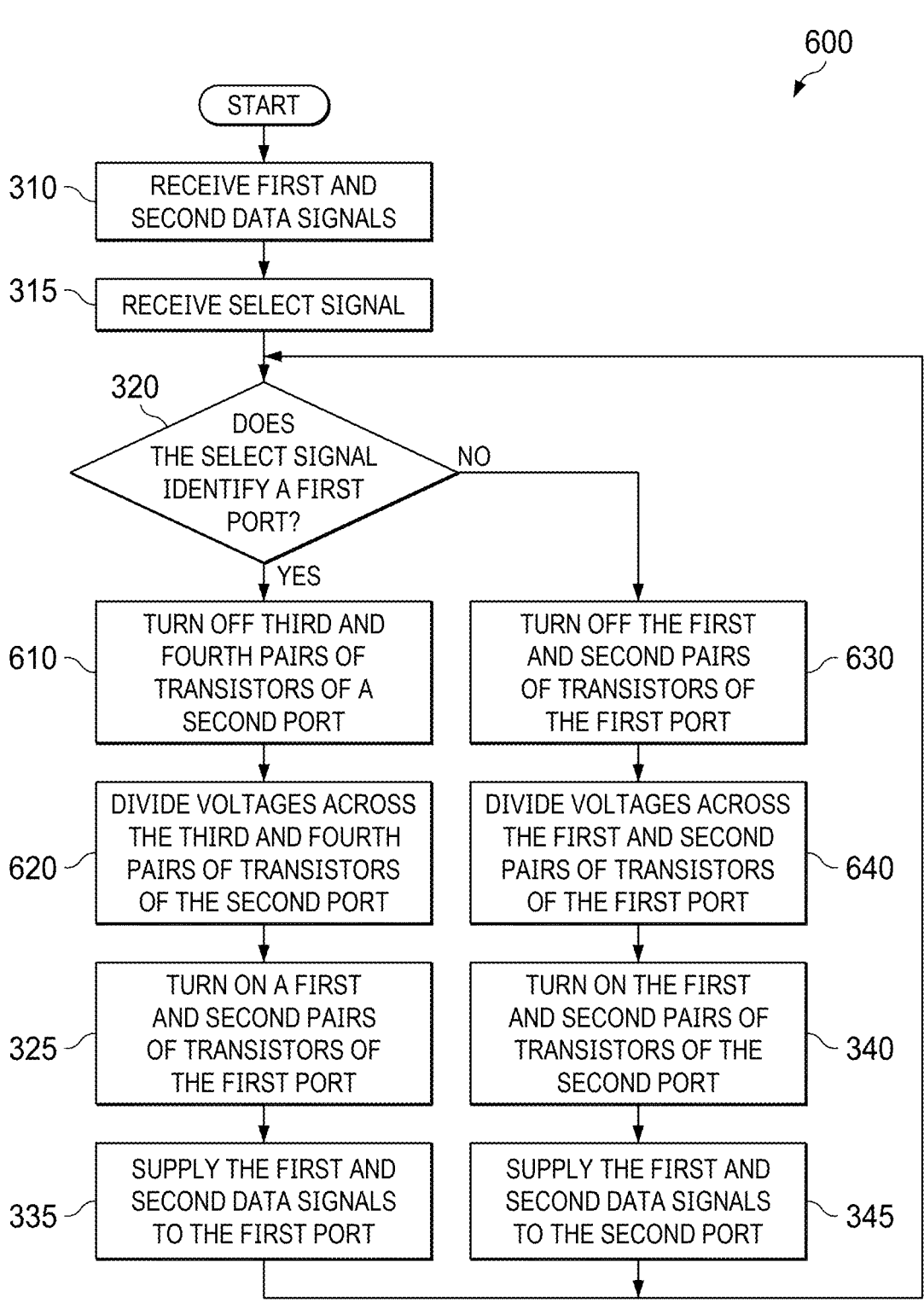
FIG. 6 is a flowchart representative of example machine-readable instructions or example operations that may be at least one of executed, instantiated, or performed using an example implementation of the signal path circuitry of FIG. 5 or more generally the multi-port multiplexer circuitry of FIGS. 1 and 2.

FIG. 6 is a flowchart representative of example machine-readable instructions or example operations 600 that may be at least one of executed, instantiated, or performed using an example implementation of the signal path circuitry 500 of FIG. 5 or more generally the multi-port multiplexer circuitry 125, 150, 205 of FIGS. 1 and 2. The example operations 600 of FIG. 6 begin with the operations of Blocks 310, 315, 320 of FIG. 3.

In the example of FIG. 5, the signal path circuitry 500 illustrates an example signal path of the plus data signal to the display port 210 of FIG. 2. In such examples, the transistors 510, 515 of FIG. 5 correspond to the transistors 225, 230 of FIG. 2. Although in the example of FIG. 5 the signal path circuitry 500 is described in reference to the plus data signal, the multi-port multiplexer circuitry 205 of FIG. 2 includes additional instances of the signal path circuitry 500 to control the transistors 235, 240, 245, 250, 255, 260 of FIG. 2. For example, the multi-port multiplexer circuitry 205 includes a first instance of the signal path circuitry 500 for the transistors 225, 230, a second instance of the signal path circuitry 500 for the transistors 235, 240, a third instance of the signal path circuitry 500 for the transistors 245, 250, and a fourth instance of the signal path circuitry 500 for the transistors 255, 260. In the example of FIG. 6, the operations 600 may be described in reference to the signal path circuitry 500 of FIG. 5. However, one or more portions of the operations 600, when implemented, are performed by different instances of the signal path circuitry 500.

If the gate driver circuitry 220, 505 of FIGS. 2 and 5 determines that the select signal identifies the first port (e.g., Block 320 returns a result of YES), the transistors 545, 550, 555, 570, 575, 580 of FIG. 5 turn off third and fourth pairs of transistors of a second port. (Block 610). In example operations, the gate driver circuitry 220, 505 turns on the transistors 545, 555, 570, 580 and turns off the transistors 550, 575 of the instances of the signal path circuitry 500 corresponding to the transistors 225, 230, 245, 250. In such example operations, the transistors 545, 555 controls the resistors 540, 560 of FIG. 5 to divide voltages of the plus and minus side data signals across the transistors 225, 230, 245, 250. Advantageously, the resistors 540, 560 limit the voltage difference between gate and source terminals of the transistors 225, 245. For example, when the plus data signal is three and six tenths volts and the resistors 540, 560 have the same resistance, the gate voltage of the transistor 510 is approximately one and eight tenths volts. In such examples, the transistor 510 remains in a safe operating area responsive to the resistors 540, 560. Advantageously, using the resistors 540, 560, 565, 585 to divide voltages of the data signals allows the transistors 225, 230, 245, 250 to be relatively low voltage transistors. Advantageously, decreasing the sizes of the transistors 225, 230, 245, 250 increases the bandwidth of the multi-port multiplexer circuitry 125, 150, 205.

The resistors 520, 525, 530, 535, 540, 560, 565, 585 of FIG. 5 divide voltages across the third and fourth pairs of transistors of the second port. (Block 620). In example operations, the resistors 520, 530 divide the voltages of the data signals between drain and source terminals of the instances of the signal path circuitry 500 corresponding to the transistors 225, 230, 245, 250. In such example operations, the resistances of the resistors 520, 525, 530, 535, 540, 560, 565, 585 evenly divide the voltages of the data signals between terminals of the transistors 225, 230, 245, 250 responsive to have the same resistance. For example, the resistors 520, 525 divide voltages of the data signals between the drain and bulk terminals of the transistors 225, 245 and the resistors 520, 540 divide voltages of the data signals between the gate and source terminals of the transistors 225, 245. Advantageously, when non-conducting (e.g., turned off) the transistors 225, 230, 245, 250 remain in a safe operating area responsive to the resistors 520, 525, 530, 535, 540, 560, 565, 585 dividing voltages of the data signals between drain, source, gate, and bulk terminals of the transistors 225, 230, 245, 250. Control proceeds to Blocks 325, 335 of FIG. 3.

If the gate driver circuitry 220, 505 determines that the select signal does not identify the first port (e.g., Block 320 returns a result of NO), the transistors 545, 550, 555, 570, 575, 580 turn off the first and second pairs of transistors of the first port. (Block 630). In example operations, the gate driver circuitry 220, 505 turns on the transistors 545, 555, 570, 580 and turns off the transistors 550, 575 of the instances of the signal path circuitry 500 corresponding to the transistors 235, 240, 255, 260. In such example operations, the transistors 545, 555 control the resistors 540, 560 to divide voltages of the plus and minus side data signals across the transistors 235, 240, 255, 260. Advantageously, the resistors 540, 560 limit the voltage difference between gate and source terminals of the transistors 235, 255. For example, when the plus side data signal is three and six tenths volts and the resistors 540, 560 have the same resistance, the gate voltage of the transistor 510 is approximately one and eight tenths volts. In such examples, the transistor 510 remains in a safe operating area responsive to the resistors 540, 560. Advantageously, using the resistors 540, 560, 565, 585 to divide voltages of the data signals allows the transistors 235, 240, 255, 260 to be relatively low voltage transistors. Advantageously, decreasing the sizes of the transistors 235, 240, 255, 260 increases the bandwidth of the multi-port multiplexer circuitry 125, 150, 205.

The resistors 520, 525, 530, 535, 540, 560, 565, 585 divide voltages across the first and second pairs of transistors of the first port. (Block 640). In example operations, the resistors 520, 530 divide the voltages of the data signals between drain and source terminals of the instances of the signal path circuitry 500 corresponding to the transistors 235, 240, 255, 260. In such example operations, the resistances of the resistors 520, 525, 530, 535, 540, 560, 565, 585 are approximately equal to evenly divide the voltages of the data signals between terminals of the transistors 235, 240, 255, 260. For example, the resistors 520, 525 divide voltages of the data signals between the drain and bulk terminals of the transistors 235, 255 and the resistors 520, 540 divide voltages of the data signals between the gate and source terminals of the transistors 235, 255. Advantageously, when non-conducting (e.g., turned off) the transistors 235, 240,

255, 260 remain in a safe operating area responsive to the resistors 520, 525, 530, 535, 540, 560, 565, 585 dividing voltages of the data signals between drain, source, gate, and bulk terminals of the transistors 235, 240, 255, 260. Control proceeds to Blocks 340, 345 of FIG. 3.

Example methods are described with reference to the flowchart illustrated in FIG. 6. However, many other methods of implementing the signal path circuitry 500 of FIG. 5 or more generally the multi-port multiplexer circuitry 125, 150, 205 of FIGS. 1 and 2 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 7:
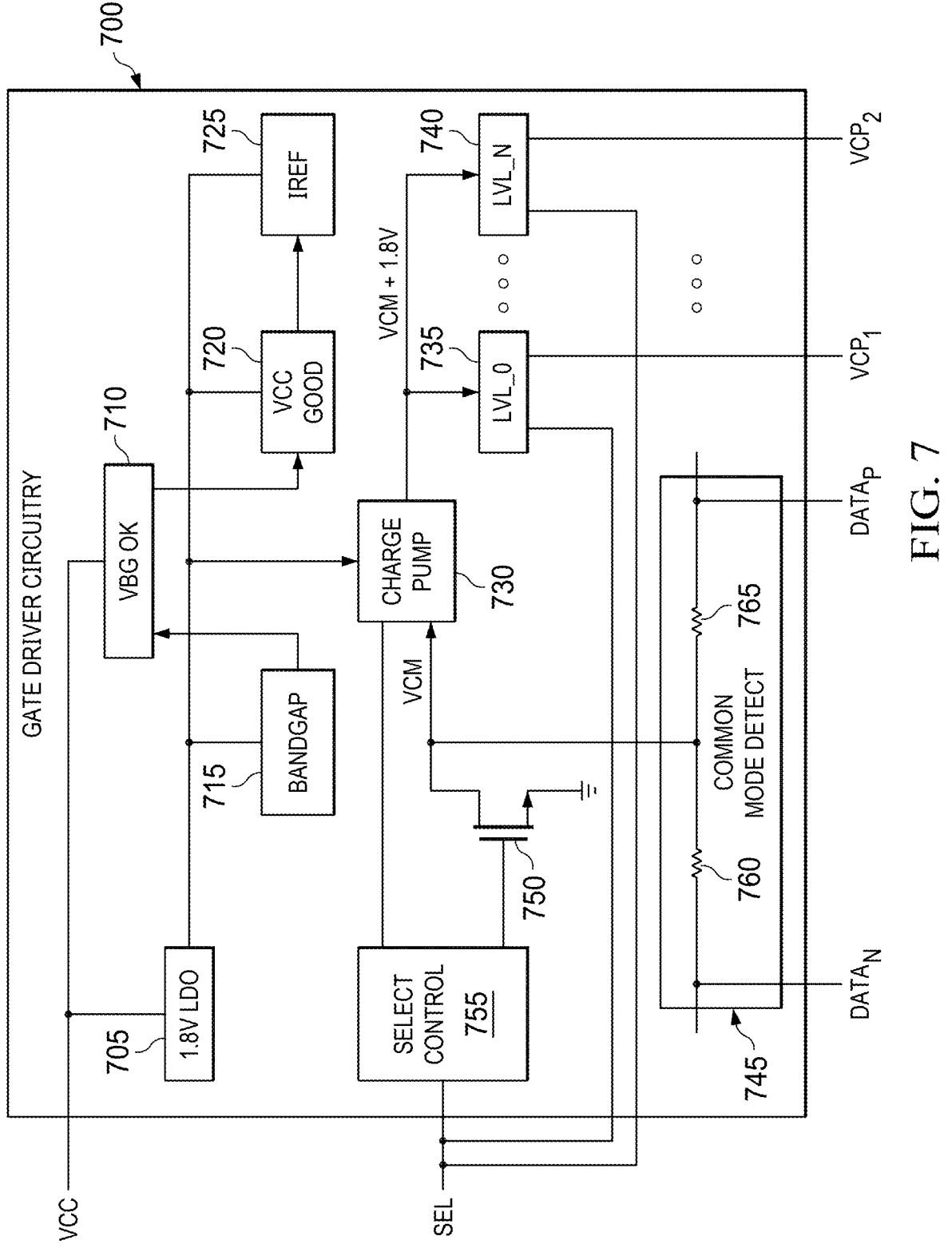
FIG. 7 is a schematic diagram of the example gate driver circuitry of FIGS. 2 and 5 including example select control circuitry.

FIG. 7 is a schematic diagram of example gate driver circuitry 700, which is an example of the gate driver circuitry 220, 505 of FIGS. 2 and 5. The example gate driver circuitry 700 of FIG. 7 includes example low dropout (LDO) regulator circuitry 705, example voltage bandgap (VBG) comparator circuitry 710, example bandgap reference circuitry 715, example supply voltage comparator circuitry 720, example reference current circuitry 725, example charge pump circuitry 730, first example level shifter circuitry 735, second example level shifter circuitry 740, example common mode detect circuitry 745, an example transistor 750, and example select control circuitry 755. The example common mode detect circuitry 745 of FIG. 7 includes a first example resistor 760 and a second example resistor 765.

The gate driver circuitry 700 has a first input, a second input, a third input, a first output, and a second output. In some examples, such as the multi-port multiplexer circuitry 125 of FIG. 1, which is on a source side of the communication system 100, the first input of the gate driver circuitry 700 is coupled to the communication circuitry 120 of FIG. 1, which supplies the plus data signal (DATA$_P$). In such examples, the second input of the gate driver circuitry 700 is coupled to the communication circuitry 120, which supplies the minus data signal (DATA$_N$). The third input of the gate driver circuitry 700 is coupled to the communication circuitry 120, which supplies the select signal (SEL). In other examples, such as the multi-port multiplexer circuitry 150 of FIG. 1, which is on a receive side of the communication system 100, the gate driver circuitry 700 may receive the plus and minus data signals from one of the ports 140, 145. In such examples, the gate driver circuitry 700 may receive the plus and minus data signals from one of the ports 130, 135. Also, the communication circuitry 150 may use a determination of which of the ports 140, 145 receive the plus and minus data signals to produce a select signal. The first output of the gate driver circuitry 700 is be coupled to the transistors 225, 230, 245, 250 of FIG. 2. The second output of the gate driver circuitry 700 is coupled to the transistors 235, 240, 255, 260 of FIG. 2.

The LDO regulator circuitry 705 has a first terminal and a second terminal. The first terminal of the LDO regulator circuitry 705 is coupled to the VBG comparator circuitry 710 and the supply terminal, which supplies the supply voltage (VCC). The second terminal of the LDO regulator circuitry 705 is coupled to the bandgap reference circuitry 715, the supply voltage comparator circuitry 720, and the reference current circuitry 725.

The VBG comparator circuitry 710 has a first terminal, a second terminal, and a third terminal. The first terminal of the VBG comparator circuitry 710 is coupled to the LDO regulator circuitry 705 and the supply terminal, which supplies the supply voltage. The second terminal of the VBG comparator circuitry 710 is coupled to the bandgap reference circuitry 715. The third terminal of the VBG comparator circuitry 710 is coupled to the supply voltage comparator circuitry 720.

The bandgap reference circuitry 715 has a first terminal and a second terminal. The first terminal of the bandgap reference circuitry 715 is coupled to the LDO regulator circuitry 705, the supply voltage comparator circuitry 720, and the reference current circuitry 725. The second terminal of the bandgap reference circuitry 715 is coupled to the VBG comparator circuitry 710.

The supply voltage comparator circuitry 720 has a first terminal, a second terminal, and a third terminal. The first terminal of the supply voltage comparator circuitry 720 is coupled to the LDO regulator circuitry 705, the bandgap reference circuitry 715, and the reference current circuitry 725. The second terminal of the supply voltage comparator circuitry 720 is coupled to the VBG comparator circuitry 710. The third terminal of the supply voltage comparator circuitry 720 is coupled to the reference current circuitry 725.

The reference current circuitry 725 has a first terminal and a second terminal. The first terminal of the reference current circuitry 725 is coupled to the supply voltage comparator circuitry 720. The second terminal of the reference current circuitry 725 is coupled to the LDO regulator circuitry 705, the bandgap reference circuitry 715, the supply voltage comparator circuitry 720, and the charge pump circuitry 730.

The charge pump circuitry 730 has a first terminal, a second terminal, a third terminal, and a fourth terminal. The first terminal of the charge pump circuitry 730 is coupled to the LDO regulator circuitry 705, the bandgap reference circuitry 715, the supply voltage comparator circuitry 720, and the reference current circuitry 725. The second terminal of the charge pump circuitry 730 is coupled level shifter circuitry 735, 740. The third terminal of the charge pump circuitry 730 is coupled to the common mode detect circuitry 745 and the transistor 750. The fourth terminal of the charge pump circuitry 730 is coupled to the select control circuitry 755.

The level shifter circuitry 735 has a first terminal, a second terminal, and a control terminal. The first terminal of the level shifter circuitry 735 is coupled to the charge pump circuitry 730. The second terminal of the level shifter circuitry 735 is coupled to the first output of the gate driver circuitry 700. The control terminal of the level shifter circuitry 735 is coupled to the third input of the gate driver circuitry 700, which supplies the select signal.

The level shifter circuitry 740 has a first terminal, a second terminal, and a control terminal. The first terminal of the level shifter circuitry 740 is coupled to the charge pump circuitry 730. The second terminal of the level shifter circuitry 735 is coupled to the second output of the gate driver circuitry 700. The control terminal of the level shifter circuitry 735 is coupled to the third input of the gate driver circuitry 700, which supplies the select signal.

The common mode detect circuitry 745 has a first terminal, a second terminal, and a third terminal. The first terminal of the common mode detect circuitry 745 is coupled to the first input of the gate driver circuitry 700, which supplies the plus side data signal. The second terminal of the common mode detect circuitry 745 is coupled to the second input of the gate driver circuitry 700, which supplies the minus side data signal. The third terminal of the common mode detect circuitry 745 is coupled to the charge pump circuitry 730 and the transistor 750.

The transistor 750 has a first terminal, a second terminal, and a control terminal. The first terminal of the transistor 750 is coupled to the charge pump circuitry 730 and the common mode detect circuitry 745. The second terminal of the transistor 750 is coupled to the common terminal, which supplies the common potential. The control terminal of the transistor 750 is coupled to the select control circuitry 755.

In the example of FIG. 7, the transistor 750 is an n-channel MOSFET. Alternatively, the transistor 750 may be an n-channel FET, an n-channel IGBT, an n-channel JFET, an NPN BJT or, with slight modifications, a p-type equivalent device. The transistor 750 may be a depletion mode device, a drain-extended device, an enhancement mode device, a natural transistor or other type of device structure transistor. Furthermore, the transistor 750 may be implemented in/over a silicon substrate (Si), a silicon carbide substrate (SiC), a gallium nitride substrate (GaN) or a gallium arsenide substrate (GaAs).

The select control circuitry 755 has a first terminal, a second terminal, and a third terminal. The first terminal of the select control circuitry 755 is coupled to the third input of the gate driver circuitry, which supplies the select signal. The second terminal of the select control circuitry 755 is coupled to the charge pump circuitry 730. The third terminal of the select control circuitry 755 is coupled to the transistor 750. An example of the select control circuitry 755 is further illustrated and described in connection with FIG. 8, below.

The resistor 760 has a first terminal and a second terminal. The first terminal of the resistor 760 is coupled to the second input of the gate driver circuitry 700, which supplies the minus side data signal. The second terminal of the resistor 760 is coupled to the charge pump circuitry 730, the transistor 750, and the resistor 765.

The resistor 765 has a first terminal and a second terminal. The first terminal of the resistor 765 is coupled to the first input of the gate driver circuitry 700, which supplies the plus side data signal. The second terminal of the resistor 765 is coupled to the charge pump circuitry 730, the transistor 750, and the resistor 760.

Figure 8:
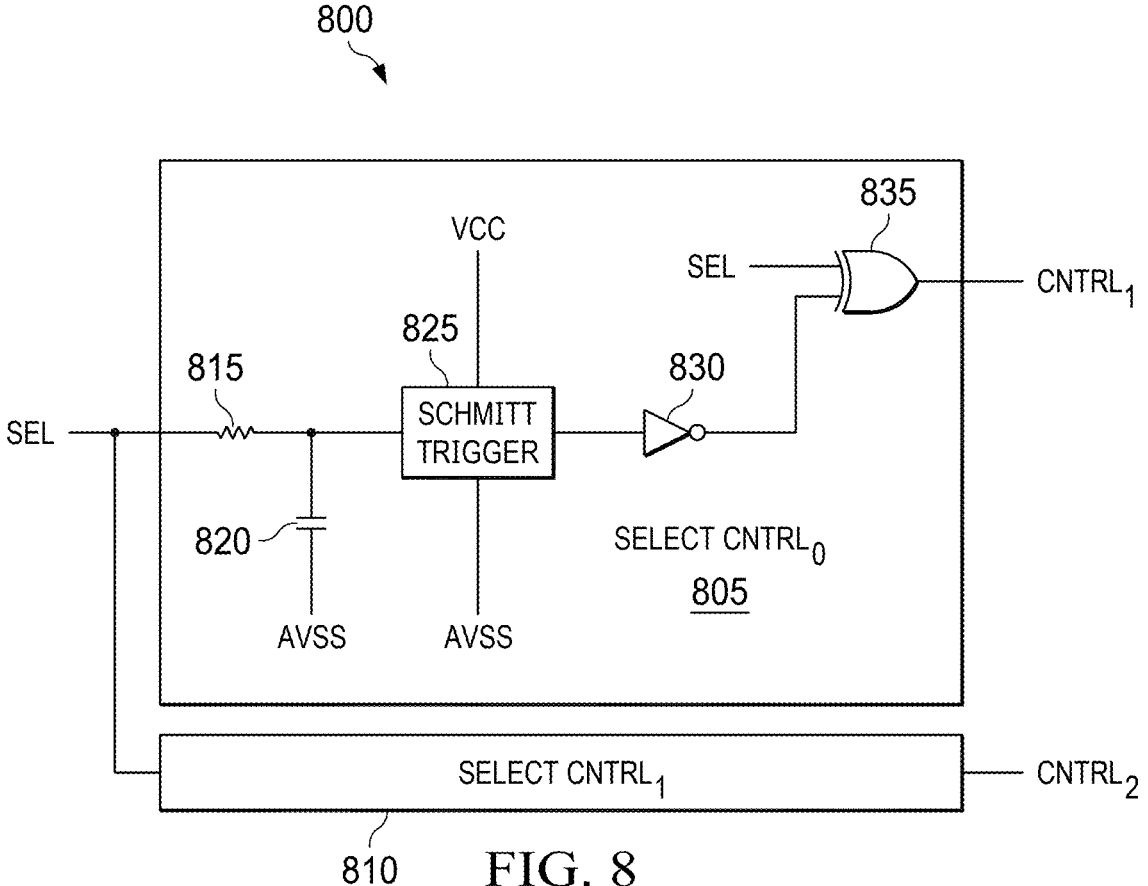
FIG. 8 is a schematic diagram of the example select control circuitry of FIG. 7.

FIG. 8 is a schematic diagram of example select control circuitry 800, which is an example of the select control circuitry 755 of FIG. 7. In the example of FIG. 8, the select control circuitry 800 includes a first select controller 805 and a second select controller 810. The example select controller 805 of FIG. 8 includes an example resistor 815, an example capacitor 820, an example Schmit trigger 825, an example inverter 830, and an example logic device 835. The select control circuitry 800 has an input, a first output, and a second output. The input of the select control circuitry 800 is coupled to the communication circuitry 120 of FIG. 1, which supplies the select signal (SEL). The first output of the select control circuitry 800 is coupled to charge pump circuitry 730 of FIG. 7. The second output of the select control circuitry 800 is coupled to the transistor 750 of FIG. 7.

The select controller 805 has an input and an output. The input of the select controller 805 is coupled to the select controller 810 and the input of the select control circuitry 800, which supplies the select signal. The output of the select controller 805 is coupled to the first output of the select control circuitry 800, which supplies a first control signal (CNTRL$_1$) to the charge pump circuitry 730.

The select controller 810 has an input and an output. The input of the select controller 810 is coupled to the select controller 805 and the input of the select control circuitry 800, which supplies the select signal. The output of the select controller 810 is coupled to the second output of the select control circuitry 800, which supplies the second control signal (CNTRL$_2$) to the transistor 750.

The resistor 815 has a first terminal and a second terminal. The first terminal of the resistor 815 is coupled to the input of the select controller 805, which supplies the select signal. The second terminal of the resistor 815 is coupled to the capacitor 820 and the Schmit trigger 825.

The capacitor 820 has a first terminal and a second terminal. The first terminal of the capacitor 820 is coupled to the resistor 815 and the Schmit trigger 825. The second terminal of the capacitor 820 is coupled to the common terminal, which supplies the common potential.

The Schmit trigger 825 has a first terminal, a second terminal, a third terminal, and a fourth terminal. The first terminal of the Schmit trigger 825 is coupled to the resistor 815 and the capacitor 820. The second terminal of the Schmit trigger 825 is coupled to the inverter 830. The third terminal of the Schmit trigger 825 is coupled to the supply terminal, which supplies the supply voltage (VCC). The fourth terminal of the Schmit trigger 825 is coupled to the common terminal, which supplies the common potential.

The inverter 830 has a first terminal and a second terminal. The first terminal of the inverter 830 is coupled to the Schmit trigger 825. The second terminal of the inverter 830 is coupled to the logic device 835.

The logic device 835 has a first terminal, a second terminal, and a third terminal. The first terminal of the logic device 835 is coupled to the input of the select controller 805, which supplies the select signal. The second terminal of the logic device 835 is coupled to the inverter 830. The third terminal of the logic device 835 is coupled to the first output of the select control circuitry 800, which supplies the first control signal. In the example of FIG. 8, the logic device 835 is an XOR gate. Alternatively, the logic device 835 may be replaced with alternative logic devices.

Figure 9:
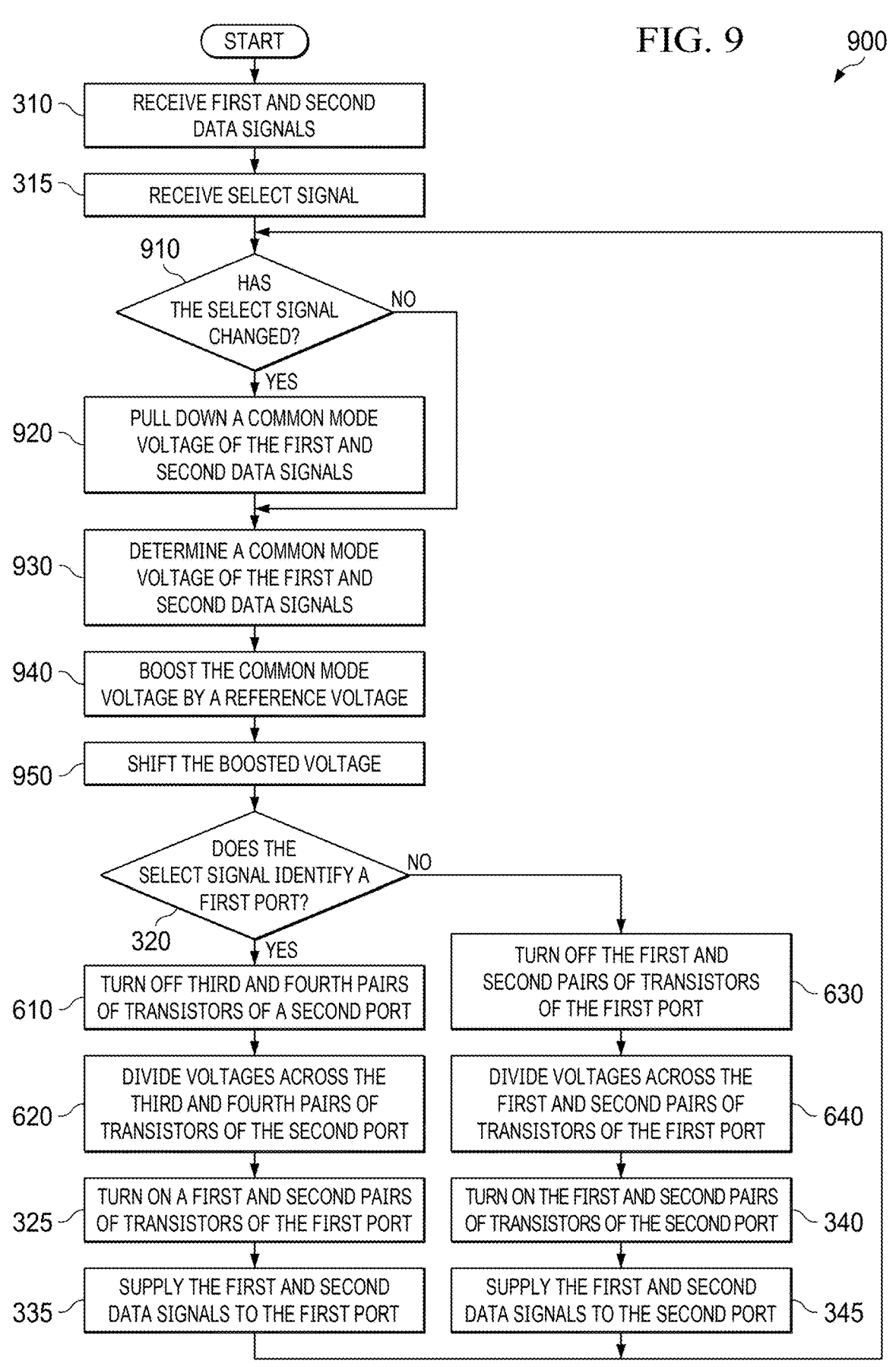
FIG. 9 is a flowchart representative of example machine-readable instructions or example operations that may be at least one of executed, instantiated, or performed using an example implementation of the select control circuitry of FIGS. 7 and 8, the gate driver circuitry of FIG. 7, or more generally the multi-port multiplexer circuitry of FIGS. 1 and 2.

FIG. 9 is a flowchart representative of example machine-readable instructions or example operations 900 that may be at least one of executed, instantiated, or performed using an example implementation of the select control circuitry 755, 800 of FIGS. 7 and 8, the gate driver circuitry 700 of FIG. 7, or more generally the multi-port multiplexer circuitry 125, 150, 205 of FIGS. 1 and 2. The example operations 900 of FIG. 9 begin with the operations of Block 310, 315 of FIG. 3.

In the example of FIG. 9, control proceeds to Block 910 at which the select controllers 805, 810 of FIG. 8 determine if the select signal has changed. In example operation, a timing constant of the resistor 815 of FIG. 8 and the capacitor 820 of FIG. 8 delays edges of the select signal. In such example operations, the Schmit trigger 825 of FIG. 8 produces a rising or falling edge responsive to the resistor 815 and the capacitor 820 producing a voltage greater than or less than a threshold voltage. The inverter 830 inverts the output of the Schmit trigger 825 to set the input of the logic device 835. The logic device 835 sets the control outputs of the select control circuitry 755, 800 for a duration of time between a change in the select signal and the inverter 830 setting the logic device 835. Advantageously, the select control circuitry 755, 800 generates pulses responsive to a change in the select signal. Advantageously, the duration of the pulses at the outputs of the select control circuitry 755, 800 are set by the timing constant of the resistor 815, and the capacitor 820.

If the select controllers 805, 810 determine that the select signal has changed (e.g., Block 910 returns a result of YES), the transistor 750 of FIG. 7 pulls down a common mode voltage of the first and second data signals. (Block 920). In example operations, the select control circuitry 755, 800 generates a first pulse responsive to a change in the select signal. In such example operations, the transistor 750 pulls down the common mode voltage of the plus and minus data signals responsive to the first pulse from the select controller 810. Also, during the first pulse, the select controller 805 generates a second pulse to disable the charge pump circuitry 730 of FIG. 7. Advantageously, pulling down the common mode voltage of the plus and minus data signals reduces a likelihood of entering an adverse state responsive to a transition to the display port 210 of FIG. 2 from the HDMI port 215 of FIG. 2. Advantageously, disabling the charge pump circuitry 730 responsive to a change in the select signal reduces a likelihood of supplying the plus and minus data signals to an incorrect port.

The common mode detect circuitry 745 of FIG. 7 determines a common mode voltage of the first and second data signals. (Block 930). In example operations, the common mode detect circuitry 745 supplies the common mode voltage of the plus and minus data signals to the charge pump circuitry 730 of FIG. 7 responsive to the resistors 760, 765 of FIG. 7 having the same resistance. In such example operations, the common mode detect circuitry 745 updates the common mode voltage after the select control circuitry 755, 800 disables the transistor 750. Advantageously, after disabling the transistors 750, the common mode detect circuitry 745 produces a common mode voltage of the updated plus and minus data signals.

The charge pump circuitry 730 of FIG. 7 boosts the common mode voltage by a reference voltage. (Block 940). In example operations, the LDO regulator circuitry 705 of FIG. 7 steps down the supply voltage to generate a reference voltage. The VBG comparator circuitry 710, the bandgap reference circuitry 715, and the supply voltage comparator circuitry 720 verify the accuracy of the reference voltage. Advantageously, the VBG comparator circuitry 710, the bandgap reference circuitry 715, and the supply voltage comparator circuitry 720 increase a likelihood of the gate driver circuitry 700 accurately driving the transistors 225, 230, 235, 240, 245, 250, 255, 260 by verifying the reference voltage. The reference current circuitry 725 of FIG. 7 boosts the current of the reference voltage to operate the charge pump circuitry 730. In such example operations, the charge pump circuitry 730 generates a control voltage proportional to the common mode voltage from the common mode detect circuitry 745 plus the reference voltage from the LDO regulator circuitry 705. Such a control voltage allows the level shifter circuitry 735, 740 of FIG. 7 to drive the transistors 225, 230, 235, 240, 245, 250, 255, 260.

The level shifter circuitry 735, 740 of FIG. 7 shifts the boosted voltage. (Block 950). In example operations, one of the level shifter circuitry 735, 740 shifts the boosted voltage from the charge pump circuitry 730 to control the transistors 225, 230, 235, 240, 245, 250, 255, 260. In such example operations, the select signal enables one of the level shifter circuitry 735, 740 to supply the data signals for one of the ports 210, 215. Advantageously, the level shifter circuitry 735, 740 shifts the boosted voltage to drive relatively low power transistors of the multi-port multiplexer circuitry 125, 150, 205. Control proceeds to perform the operations of Blocks 325, 335, 340, 345, 610, 620, 630, 640 of FIGS. 3 and 6.

Example methods are described with reference to the flowchart illustrated in FIG. 6. However, many other methods of implementing the select control circuitry 755, 800 of FIGS. 7 and 8, the gate driver circuitry 700 of FIG. 7, or more generally the multi-port multiplexer circuitry 125, 150, 205 of FIGS. 1 and 2 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 10:
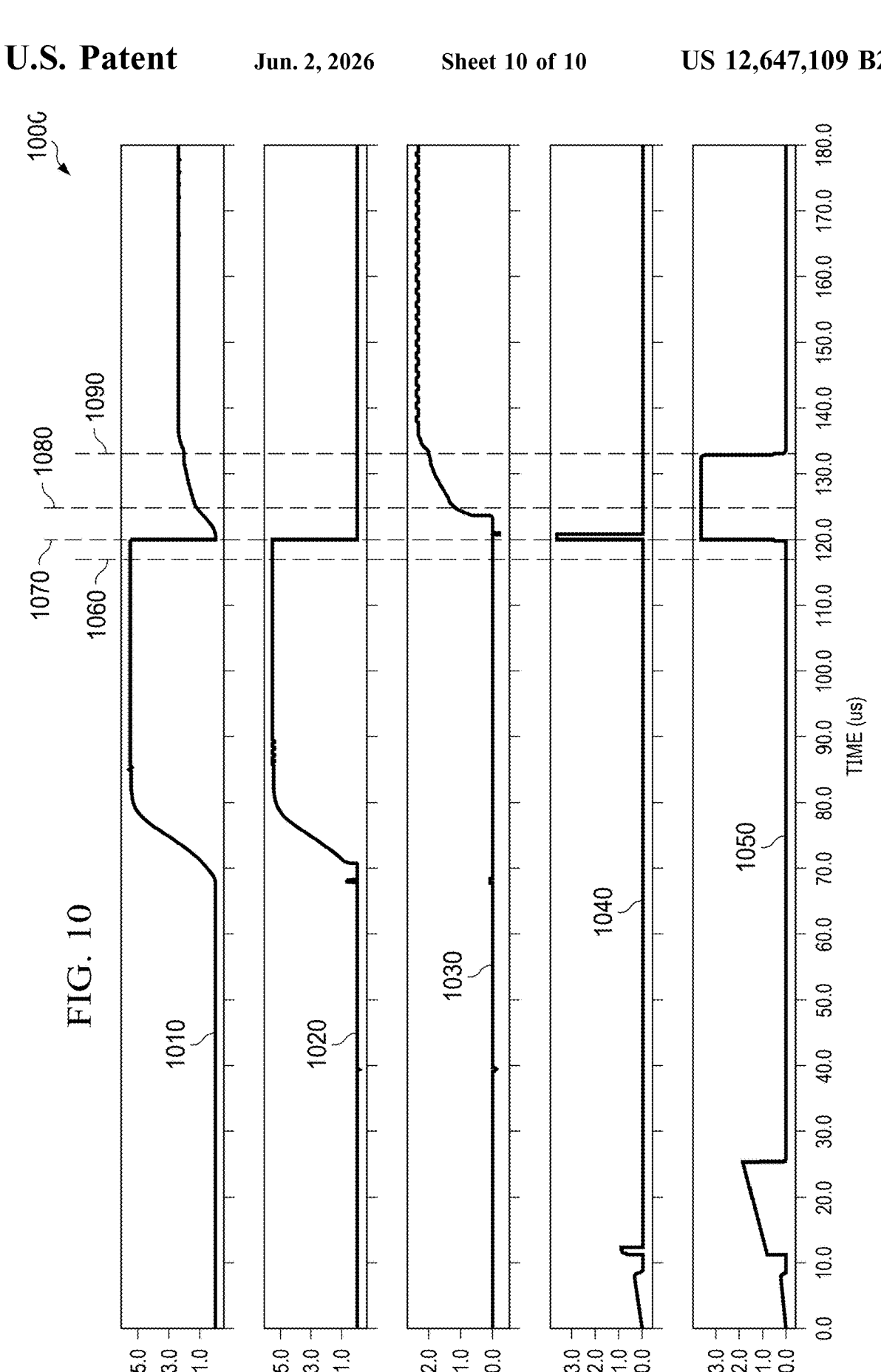
FIG. 10 is a timing diagram of example operations of the gate driver circuitry of FIGS. 2, 5, and 7.

FIG. 10 is a timing diagram 1000 of example operations of the gate driver circuitry 220, 505, 700 of FIGS. 2, 5, and 7. The example timing diagram 1000 of FIG. 10 includes an example charge pump supply output 1010, a first example level shifter output 1020, a second example level shifter output 1030, an example select change signal 1040, and an example common mode discharge signal 1050. The charge pump supply output 1010 represents the boosted voltage from the charge pump circuitry 730. For example, the voltage resulting from the operations of Block 940 of FIG. 9.

The level shifter output 1020 represents an output of the level shifter circuitry 740 of FIG. 7, which controls the supply of signals to the HDMI port 215 of FIG. 2. The level shifter output 1030 represents an output of the level shifter circuitry 735 of FIG. 7, which controls the supply of signals to the display port 210 of FIG. 2. The select change signal 1040 represents the first output of the select control circuitry 755, 800 of FIGS. 7 and 8, which disables the charge pump circuitry 730 of FIG. 7. For example, the select change signal 1040 is the output of the select control circuitry 805 of FIG. 8. The common mode discharge signal 1050 represents the second output of the select control circuitry 755, 800, which controls the transistor 750 of FIG. 7. For example, the common mode discharge signal 1050 is the output of the select control circuitry 810 of FIG. 8.

At a first time 1060, the charge pump supply output 1010 is proportional to the common mode voltage of the plus and minus data signals plus the reference voltage from the LDO regulator circuitry 705 of FIG. 7. At the first time 1060, the common mode voltage of the plus and minus data signals is non-zero, which represents an HDMI signal. At the first time 1060, the select signal turns on the level shifter circuitry 740 to set the level shifter output 1020 and turn on the transistors 235, 240, 255, 260 of FIG. 2. At the second time 1060, the select signal turns off the level shifter circuitry 735 to set the level shifter output 1030 to the common potential, which turns off the transistors 225, 230, 245, 250 of FIG. 2.

At a second time 1070, the select controllers 805, 810 generate rising edges of the select change signal 1040 and the common mode discharge signal 1050 responsive to the select control circuitry 755, 800 detecting a change in the select signal. At the second time 1070, the select change signal 1040 resets the charge pump circuitry 730 to clear the charge pump supply output 1010 and the level shifter output 1020. Also at the second time 1070, the common mode discharge signal 1050 turns on the transistor 750, which pulls down the common mode of the plus and minus data signals.

At a third time 1080, the select change signal 1040 has cleared, which allows the charge pump supply output 1010 to approach the reference voltage from the LDO regulator circuitry 705. At the third time 1080, the select signal turns on the level shifter circuitry 735, which begins to set the level shifter output 1030, and turns off the level shifter circuitry 740.

At a fourth time 1090, the select controller 810 clears the common mode discharge signal 1050, which turns off the transistor 750. At the fourth time 1090, the charge pump supply output 1010 has settled at the reference voltage. At the fourth time 1090, the level shifter output 1030 turns on the transistors 225, 230, 245, 250 to route the plus and minus data signals to the display port 210. Advantageously, the delays of the select change signal 1040 and the common mode discharge signal 1050 allow the common mode voltage of the plus and minus data signals to settle before modifying the multi-port multiplexer circuitry 125, 205. Advantageously, the delays of the select change signal 1040 and the common mode discharge signal 1050 prevent the relatively high common mode voltage of HDMI signals from pulling up the common mode voltage of the plus and minus data signals.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and things, the phrase "at least one of A and B" refers to implementations including any of (1) at least one A, (2) at least one B, or (3) at least one A and at least one B. Similarly, as used herein in the context of describing structures, components, items, objects and things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is at least one of not feasible or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by at least one of the connection reference or relative movement between those elements unless otherwise indicated. As such, connection references do not necessarily infer that two elements are directly connected or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, or ordering in any way, but are merely used as at least one of labels or arbitrary names to distinguish elements for case of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to at least one of manufacturing tolerances or other real-world imperfections. For example, "approximately" and "about" may indicate such dimensions may be within a tolerance range of +/−10% unless otherwise specified herein.

As used herein, the phrase "in communication," including variations thereof, encompasses one of or a combination of direct communication or indirect communication through one or more intermediary components, and does not require direct physical (e.g., wired) communication or constant communication, but rather also includes selective communication at least one of periodic intervals, scheduled intervals, aperiodic intervals, or one-time events.

As used herein, "programmable circuitry" is defined to include at least one of (i) one or more special purpose electrical circuits (e.g., an application specific circuit (ASIC)) structured to perform specific operation(s) and including one or more semiconductor-based logic devices (e.g., electrical hardware implemented by one or more transistors), or (ii) one or more general purpose semiconductor-based electrical circuits programmable with instructions to perform one or more specific functions(s) or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations or functions, Field Programmable Gate Arrays (FPGAs) that may be programmed with second instructions to at least one of configure or structure the FPGAs to instantiate one or more operations or functions corresponding to the first instructions, Graphics Processor Units (GPUs) that may execute first instructions to perform one or more operations or functions, Digital Signal Processors (DSPs) that may execute first instructions to perform one or more operations or functions, XPUs, Network Processing Units (NPUs) one or more microcontrollers that may execute first instructions to perform one or more operations or functions or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., at least one of programmed or hardwired) at a time of manufacturing by a manufacturer to at least one of perform the function or be configurable (or re-configurable) by a user after manufacturing to perform the function/or other additional or alternative functions. The configuring may be through at least one of firmware or software programming of the device, through at least one of a construction or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as voltage and/or current sources) may instead include only the semiconductor elements within a single physical device (e.g., at least one of a semiconductor die or integrated circuit (IC) package) and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

What is claimed is:

1. An apparatus having a first data terminal and a second data terminal, and the apparatus comprising:

a first transistor having a first terminal, a second terminal, and a control terminal;

a second transistor having a first terminal and a control terminal, the first terminal of the second transistor coupled to the first terminal of the first transistor;

a third transistor having a first terminal, a second terminal, and a control terminal;

a fourth transistor having a first terminal and a control terminal, the first terminal of the fourth transistor coupled to the first terminal of the third transistor; and gate driver circuitry having a first terminal, a second terminal, a third terminal, and a fourth terminal, the first terminal of the gate driver circuitry coupled to the first data terminal, and the second terminal of the first transistor, the second terminal of the gate driver circuitry coupled to the second data terminal and the second terminal of third transistor, the third terminal of the gate driver circuitry coupled to the control terminal of the first transistor and the control terminal of the second transistor, the fourth terminal of the gate driver circuitry coupled to the control terminal of the third transistor and the control terminal of the fourth transistor.

2. The apparatus of claim 1, further comprising a resistor having a first terminal and a second terminal, the first terminal of the resistor is coupled to the first terminal of the first transistor and the first terminal of the second transistor, the second terminal of the resistor is coupled to the first terminal of the third transistor and the first terminal of the fourth transistor.

3. The apparatus of claim 1, wherein the gate driver circuitry further having a fifth terminal and a sixth terminal, and the apparatus further comprising:

a fifth transistor having a first terminal, a second terminal, and a control terminal, the first terminal of the fifth transistor coupled to the first data terminal, the second terminal of the first transistor first terminal of the gate driver circuitry;

a sixth transistor having a first terminal and a control terminal, the first terminal of the sixth transistor is coupled to the second terminal of the fifth transistor, the control terminal of the sixth transistor is coupled to the fifth terminal of the gate driver circuitry and the control terminal of the fifth transistor;

a seventh transistor having a first terminal, a second terminal, and a control terminal, the first terminal of the seventh transistor is coupled to the second data terminal, the second terminal of the third transistor, and the second terminal of the gate driver circuitry; and an eighth transistor having a first terminal and a control terminal, the first terminal of the eighth transistor is coupled to the second terminal of the seventh transistor, the control terminal of the eighth transistor is coupled to the control terminal of the seventh transistor and the sixth terminal of the gate driver circuitry.

4. The apparatus of claim 3, wherein the second transistor further has a second terminal, the fourth transistor further has a second terminal, the sixth transistor further has a second terminal, the eighth transistor further has a second terminal, and the apparatus further comprising:

a display port having a first terminal and a second terminal, the first terminal of the display port is coupled to the second terminal of the second transistor, the second terminal of the display port is coupled to the second terminal of the sixth transistor; and a high-definition multimedia interface (HDMI) port having a first terminal and a second terminal, the first terminal of the HDMI port is coupled to the second terminal of the fourth transistor, the second terminal of the HDMI port is coupled to the second terminal of the eighth transistor.

5. The apparatus of claim 1, wherein the first transistor further has a bulk terminal, the second transistor further has a second terminal and a bulk terminal, and the apparatus further comprising:

a first resistor having a first terminal and a second terminal, the first terminal of the first resistor is coupled to the bulk terminal of the first transistor;

a second resistor having a first terminal and a second terminal, the first terminal of the second resistor is coupled to the bulk terminal of the second transistor;

a third resistor having a first terminal and a second terminal, the first terminal of the third resistor is coupled to the first data terminal, the second terminal of the first transistor, and the first terminal of the gate driver circuitry; and

a fourth resistor having a first terminal and a second terminal, the first terminal of the fourth resistor is coupled to the second terminal of the second transistor, the second terminal of the fourth resistor is coupled to the first terminal of the first transistor, the first terminal of the second transistor, the second terminal of the first resistor, the second terminal of the second resistor, and the second terminal of the third resistor.

6. The apparatus of claim 5, further comprising:

a fifth resistor having a first terminal and a second terminal, the first terminal of the fifth resistor is coupled to the first data terminal, the second terminal of the first transistor, the first terminal of the gate driver circuitry, and the first terminal of the third transistor;

a fifth transistor having a first terminal and a second terminal, the first terminal of the fifth transistor is coupled to the second terminal of the fifth resistor;

a sixth transistor having a first terminal and a second terminal, the first terminal of the sixth transistor is coupled to the third terminal of the gate driver circuitry;

a seventh transistor having a first terminal and a second terminal, the first terminal of the seventh transistor is coupled to the control terminal of the first transistor, the second terminal of the fifth transistor, and the second terminal of the sixth transistor; and a sixth resistor having a terminal coupled to the second terminal of the seventh transistor.

7. The apparatus of claim 1, wherein the gate driver circuitry includes:

common mode voltage detect circuitry having a first terminal, a second terminal, and a third terminal, the first terminal of the common mode voltage detect circuitry is coupled to the first data terminal and the second terminal of the first transistor, the second terminal of the common mode voltage detect circuitry is coupled to the second data terminal and the second terminal of the third transistor;

a fifth transistor having a first terminal and a control terminal;

charge pump circuitry having a first terminal and a second terminal, the first terminal of the charge pump circuitry is coupled to the third terminal of the common mode voltage detect circuitry and the first terminal of the fifth transistor; and select control circuitry having a terminal coupled to the control terminal of the fifth transistor.

8. The apparatus of claim 7, wherein the select control circuitry includes:

a resistor having a terminal;

a capacitor having a terminal;

a Schmit trigger having a first terminal and a second terminal, the first terminal of the Schmit trigger coupled to the terminal of the resistor and the terminal of the capacitor; and a logic device having a first terminal and a second terminal, the first terminal of the logic device coupled to the second terminal of the Schmit trigger, the second terminal of the logic device coupled to the control terminal of the fifth transistor.

9. An apparatus comprising:

charge pump circuitry having an input and an output;

level shifter circuitry having an input, a first output, and a second output, the input of the level shifter circuitry coupled to the output of the charge pump circuitry;

a first transistor having a first terminal, a second terminal, and a control terminal;

a second transistor having a first terminal, a second terminal, and a control terminal, the first terminal of the second transistor coupled to the input of the charge pump circuitry and the first terminal of the first transistor;

a third transistor having a first terminal and a control terminal, the first terminal of the third transistor coupled to the second terminal of the first transistor, the control terminal of the third transistor coupled to the first output of the level shifter circuitry and the control terminal of the first transistor; and a fourth transistor having a first terminal and a control terminal, the first terminal of the fourth transistor coupled to the second terminal of the second transistor, the control terminal of the fourth transistor coupled to the second output of the level shifter circuitry and the control terminal of the second transistor.

10. The apparatus of claim 9, wherein the level shifter circuitry is first level shifter circuitry, and the apparatus further comprising:

second level shifter circuitry having an input, a first output, and a second output, the input of the second level shifter circuitry is coupled to the output of the charge pump circuitry and the input of the first level shifter circuitry;

a fifth transistor having a first terminal, a second terminal, and a control terminal;

a sixth transistor having a first terminal, a second terminal, and a control terminal, the first terminal of the sixth transistor is coupled to the input of the charge pump circuitry and the first terminal of the fifth transistor;

a seventh transistor having a first terminal and a control terminal, the first terminal of the seventh transistor is coupled to the second terminal of the fifth transistor, the control terminal of the seventh transistor is coupled to the first output of the second level shifter circuitry and the control terminal of the fifth transistor; and an eighth transistor having a first terminal and a control terminal, the first terminal of the eighth transistor is coupled to the second terminal of the sixth transistor, the control terminal of the eighth transistor is coupled to the second output of the second level shifter circuitry and the control terminal of the sixth transistor.

11. The apparatus of claim 10, further comprising a resistor having a first terminal and a second terminal, the first terminal of the resistor is coupled to the second terminal of the first transistor and the first terminal of the third transistor, the second terminal of the resistor is coupled to the second terminal of the fifth transistor and the first terminal of the seventh transistor.

12. The apparatus of claim 9, wherein the third transistor further has a second terminal, the fourth transistor further has a second terminal, and the apparatus further comprising:

a display port having a terminal coupled to the second terminal of the fourth transistor; and a high-definition multimedia interface (HDMI) port having a terminal coupled to the second terminal of the third transistor.

13. The apparatus of claim 9, wherein the first transistor further has a bulk terminal, the third transistor further has a second terminal and a bulk terminal, and the apparatus further comprising:

a first resistor having a first terminal and a second terminal, the first terminal of the first resistor is coupled to the bulk terminal of the first transistor;

a second resistor having a first terminal and a second terminal, the first terminal of the second resistor is coupled to the bulk terminal of the third transistor;

a third resistor having a first terminal and a second terminal, the first terminal of the third resistor is coupled to the input of the charge pump circuitry, the first terminal of the first transistor, and the first terminal of the second transistor; and a fourth resistor having a first terminal and a second terminal, the first terminal of the fourth resistor is coupled to the second terminal of the third transistor, the second terminal of the fourth resistor is coupled to the second terminal of the first transistor, the first terminal of the third transistor, the second terminal of the first resistor, the second terminal of the second resistor, and the second terminal of the third resistor.

14. The apparatus of claim 9, further comprising:

common mode voltage detect circuitry having an input and an output, the input of the common mode voltage detect circuitry is coupled to the first terminal of the first transistor and the first terminal of the second transistor;

a fifth transistor having a first terminal and a control terminal, the first terminal of the fifth transistor coupled to the input of the charge pump circuitry and the output of the common mode voltage detect circuitry; and select control circuitry having a terminal coupled to the control terminal of the fifth transistor.

15. An apparatus comprising:

gate driver circuitry having an input, a first output, and a second output;

a first transistor having a first terminal, a second terminal, a control terminal, and a bulk terminal, the control terminal of the first transistor coupled to the first output of the gate driver circuitry;

a first resistor having a first terminal and a second terminal, the first terminal of the first resistor coupled to the bulk terminal of the first transistor;

a second resistor having a first terminal and a second terminal, the first terminal of the second resistor coupled to the input of the gate driver circuitry and the first terminal of the first transistor;

a second transistor having a first terminal, a second terminal, a control terminal, and a bulk terminal, the control terminal of the second transistor coupled to the second output of the gate driver circuitry;

a third resistor having a first terminal and a second terminal, the first terminal of the third resistor coupled to the bulk terminal of the second transistor; and a fourth resistor having a first terminal and a second terminal, the first terminal of the fourth resistor coupled to the first terminal of the second transistor, the second terminal of the fourth resistor coupled to the second terminal of the first transistor, the second terminal of the second transistor, the second terminal of the first resistor, the second terminal of the second resistor, and the second terminal of the third resistor.

16. The apparatus of claim 15, further comprising:

a fifth resistor having a first terminal and a second terminal, the first terminal of the fifth resistor is coupled to the input of the gate driver circuitry, the first terminal of the first transistor, and the first terminal of the second resistor;

a third transistor having a first terminal and a second terminal, the first terminal of the third transistor is coupled to the second terminal of the fifth resistor;

a fourth transistor having a first terminal and a second terminal, the first terminal of the fourth transistor is coupled to the first output of the gate driver circuitry;

a fifth transistor having a first terminal and a second terminal, the first terminal of the fifth transistor is coupled to the control terminal of the first transistor, the second terminal of the third transistor, and the second terminal of the fourth transistor; and a sixth resistor having a terminal coupled to the second terminal of the fifth transistor.

17. The apparatus of claim 15, wherein the input of the gate driver circuitry is a first input, the gate driver circuitry further having a second input, a third output, and a fourth output, and the apparatus further comprising:

a third transistor having a first terminal, a second terminal, and a control terminal, the first terminal of the third transistor is coupled to the second input of the gate driver circuitry, the control terminal of the third transistor is coupled to the third output of the gate driver circuitry; and a fourth transistor having a first terminal and a control terminal, the first terminal of the fourth transistor is coupled to the second terminal of the third transistor, the control terminal of the fourth transistor is coupled to the fourth output of the gate driver circuitry.

18. The apparatus of claim 17, wherein the fourth transistor further has a second terminal, and the apparatus further comprising:

a fifth resistor having a first terminal and a second terminal, the first terminal of the fifth resistor is coupled to the second terminal of the first transistor, the second terminal of the second transistor, the second terminal of the first resistor, the second terminal of the second resistor, the second terminal of the third resistor, and the second terminal of the fourth resistor, the second terminal of the fifth resistor is coupled to the second terminal of the third transistor and the first terminal of the fourth transistor; and a high-definition multimedia interface (HDMI) port having a first terminal and a second terminal, the first terminal of the HDMI port is coupled to the first terminal of the second transistor and the first terminal of the fourth resistor, the second terminal of the HDMI port is coupled to the second terminal of the fourth transistor.

19. The apparatus of claim 17 wherein the fourth transistor further has a second terminal, and the apparatus further comprising a display port having a first terminal and a second terminal, the first terminal of the display port is coupled to the first terminal of the second transistor and the first terminal of the fourth resistor, the second terminal of the display port is coupled to the second terminal of the fourth transistor.

20. The apparatus of claim 15, wherein the gate driver circuitry includes:

common mode voltage detect circuitry having an input and an output, the input of the common mode voltage detect circuitry is coupled to the first terminal of the first transistor and the first terminal of the second resistor;

a third transistor having a first terminal and a control terminal;

charge pump circuitry having an input and an output, the input of the charge pump circuitry is coupled to the output of the common mode voltage detect circuitry and the first terminal of the third transistor;

level shifter circuitry having an input and an output, the input of the level shifter circuitry is coupled to the output of the charge pump circuitry, the output of the level shifter circuitry is coupled to the control terminal of the first transistor; and select control circuitry having a terminal coupled to the control terminal of the third transistor.

* * * * *